US010707750B1

(12) United States Patent
Khanna et al.

(10) Patent No.: US 10,707,750 B1
(45) Date of Patent: Jul. 7, 2020

(54) CHARGE-BASED CHARGE PUMP WITH WIDE OUTPUT VOLTAGE RANGE

(71) Applicant: Delta Electronics Int'l (Singapore) Pte Ltd, Singapore (SG)

(72) Inventors: Devrishi Khanna, Singapore (SG); Chirn Chye Boon, Singapore (SG); Kaituo Yang, Singapore (SG); Jack Sheng Kee, Singapore (SG)

(73) Assignee: DELTA ELECTRONICS INT'L (SINGAPORE) PTE LTD, Singapore (SG)

( * ) Notice: Subject to any disclaimer, the term of this patent is extended or adjusted under 35 U.S.C. 154(b) by 0 days.

(21) Appl. No.: 16/503,745

(22) Filed: Jul. 5, 2019

(51) Int. Cl.
*H02M 3/07* (2006.01)
*H02M 1/00* (2006.01)
*H03K 19/20* (2006.01)

(52) U.S. Cl.
CPC ............. *H02M 3/07* (2013.01); *H02M 1/00* (2013.01); *H02M 2001/0012* (2013.01); *H03K 19/20* (2013.01)

(58) Field of Classification Search
CPC ................................ H02M 3/07; H02M 3/073
See application file for complete search history.

(56) References Cited

U.S. PATENT DOCUMENTS

| 6,664,829 | B1 * | 12/2003 | Hughes ................. H03L 7/0895 327/148 |
| 7,574,985 | B2 * | 8/2009 | Kirchberger ............ F02B 25/02 123/73 A |
| 8,525,564 | B2 * | 9/2013 | Schober ................ H03L 7/0896 327/148 |
| 9,397,557 | B2 | 7/2016 | Chiu et al. |
| 9,806,724 | B1 | 10/2017 | Mojtaba et al. |

* cited by examiner

Primary Examiner — Hai L Nguyen
(74) Attorney, Agent, or Firm — Kirton McConkie; Evan R. Witt

(57) ABSTRACT

A charge-based charge pump with wide output voltage range is provided. In the charge-based charge pump, the digital logic circuit is configured to receive an up pulse signal and a down pulse signal and output a plurality of switching signals for controlling the first NMOS, the positive hold subcircuit, the first dynamic body-bias generator, the positive charge transfer subcircuit, the first static body-bias generator, the first PMOS, the negative hold subcircuit, the second dynamic body-bias generator, the negative charge transfer subcircuit and the second static body-bias generator electrically connected therewith, so as to allow the output voltage to range from −0.84·VDD to 1.82·VDD. The charge-based charge pump is triggered by the up or down pulse signal or works in a default state, and the top plate and the bottom plate of the pump capacitor are electrically connected to different node and terminal according to the plurality of switching signals.

15 Claims, 21 Drawing Sheets

US 10,707,750 B1

CHARGE-BASED CHARGE PUMP WITH WIDE OUTPUT VOLTAGE RANGE

FIELD OF THE DISCLOSURE

The present disclosure relates to a charge pump, and more particularly to a charge-based charge pump (CBCP), with wide output voltage range (from −0.84·VDD to 1.82·VDD), for wide tuning range frequency synthesizer applications. It can be utilized for multiple applications requiring negative or higher-than-supply positive bias potential.

BACKGROUND OF THE DISCLOSURE

Conventionally, the charge pump used within a frequency synthesizer (PLL), includes a pair of current mirror device, which is in response to a trigger input by the incoming up or down pulse signal, source or sink a fixed magnitude of current into the loop filter. This charge pump is widely employed in all analog PLL implementations due to its linear characteristics and low noise performance. However, the performance of this charge pump is affected by a wide range of inherent nonlinearities, such as up-down current mismatch, charge injection, clock feedthrough, and require intricate layout to suppress the random mismatches between the large current mirror devices. In addition, the useable linear output voltage range is a subset of the total available range from ground (0V) to the supply potential (VDD) and is typically less than 70% of the VDD. Moreover, the cascoding implemented within the constant current branches further restricts the output voltage range and the minimum supply voltage that can be utilized.

Further to this, in a PLL environment, the current (or charge) mismatch arising from the charge pump (hereinafter referred to as "CP") directly translates into a reference spur at the PLL output spectrum. Therefore, the conventional current mirror CP commonly employs a high-gain auxiliary feedback loop to obtain precise matching of the UP-DN current magnitude. An example of such implementation is shown in FIG. 1 (Prior Art-1). As seen from FIG. 1, this implementation requires a rail-to-rail input/output range amplifier and comprises of replica bias paths that remain turned on, even when CP is in idle state (no UP or DN pulse input provided to the CP). Therefore, the state-of-the-art current-mirror CP implementation results in significantly increased complexity, power and area utilization.

In order to effectively suppress CP nonlinearities, a charge-based charge pump is proposed in Schober et al. [U.S. Pat. No. 8,525,564B2]. As indicated in FIG. 2 (Prior Art-2), the charge from pump capacitor, nominally charged to VDD, is shared to the load capacitor, following the trigger input by the incoming UP/DN pulse inputs. This capacitive charge re-distribution scheme results in improved matching performance and lower power consumption. However, due to the involved capacitive charge-sharing the useable linear range is even lower than the former case.

In this patent a novel charge-based charge pump architecture is proposed. The proposed CP retains all the merits of earlier charge-based charge pump, while extending the output voltage range from −0.84·VDD to 1.82·VDD. The approximated linear output voltage range also extends from ~−0.7·VDD to ~1.4·VDD. Such wide output voltage range can be utilized for wide tuning-range voltage-controlled oscillator (VCO)/PLL implementations. In addition, the steady-state ripple magnitude is less than 0.03% of its saturated output at −0.84·VDD/1.82·VDD, and the CP response is free from any memory effect. Thus, the proposed design can be employed for multiple applications, such as RF-Antenna switches, that can exploit the negative or higher-than-supply positive potential output from the CP.

SUMMARY OF THE DISCLOSURE

It is an object of the present disclosure to provide a charge-based charge pump with wide output voltage range. The given charge-based charge pump powered by a standard supply potential (VDD), provides an output voltage range from −0.84·VDD to 1.82·VDD, thus extending its operation well beyond the headroom defined by input supply rails. Meanwhile, the approximated linear output voltage range extends from ~−0.7·VDD to 1.4·VDD, thus achieving a total useable output voltage range of ~2.1·VDD for PLL and other similar applications that operate within the linear region of the CP transfer characteristic. In addition, the charge pump transfer characteristic of the charge-based charge pump is free from any memory effect. This implies that the time lapsed to reach from one potential to another is independent of the prior state of charge pump.

In accordance with an aspect of the present disclosure, there is provided a charge-based charge pump with wide output voltage range. The charge-based charge pump includes an input supply node, a ground node at 0V, an output node, a pump capacitor, a first NMOS, a positive hold subcircuit, a first dynamic body-bias generator, a positive charge transfer subcircuit, a first static body-bias generator, a first PMOS, a negative hold subcircuit, a second dynamic body-bias generator, a negative charge transfer subcircuit, a second static body-bias generator and a digital logic circuit. The input supply node is configured for receiving an input supply voltage at a supply potential. The output node is configured for outputting an output voltage. The pump capacitor includes a top plate and a bottom plate. The first NMOS is electrically connected between the ground node and the top plate. The positive hold subcircuit is electrically connected between the input supply node and the top plate. The first dynamic body-bias generator is electrically connected with the positive hold subcircuit. The positive charge transfer subcircuit is electrically connected between the top plate and the output node. The first static body-bias generator is electrically connected with the positive charge transfer subcircuit and the top plate. The first PMOS is electrically connected between the input supply node and the bottom plate. The negative hold subcircuit is electrically connected between the ground node and the bottom plate. The second dynamic body-bias generator is electrically connected with the negative hold subcircuit. The negative charge transfer subcircuit is electrically connected between the bottom plate and the output node. The second static body-bias generator is electrically connected with the negative charge transfer subcircuit and the bottom plate. The digital logic circuit is configured to receive an up pulse signal and a down pulse signal and output a plurality of switching signals for controlling the first NMOS, the positive hold subcircuit, the first dynamic body-bias generator, the positive charge transfer subcircuit, the first static body-bias generator, the first PMOS, the negative hold subcircuit, the second dynamic body-bias generator, the negative charge transfer subcircuit and the second static body-bias generator electrically connected therewith, so as to allow the charge-based charge pump to achieve the output voltage ranging from −0.84·VDD to 1.82·VDD. When the charge-based charge pump is operating in the default state, the top plate is electrically connected to the input supply node and is isolated from the output node, and the bottom plate is electrically connected to the ground node and is isolated from the output node. When the charge-based charge pump is triggered by the up pulse signal, the top plate is isolated from the input supply node and is electrically connected to the output node, and the bottom plate is electrically connected to the input supply node and is isolated from the ground node and the output node. When the charge-based charge pump is triggered by the down pulse signal, the top plate is electrically connected to the ground node and is isolated from the input supply node and the output node, and the bottom plate is isolated from the ground node and is electrically connected to the output node.

DETAILED DESCRIPTION OF THE PREFERRED EMBODIMENT

The present disclosure will now be described more specifically with reference to the following embodiments. It is to be noted that the following descriptions of preferred embodiments of this disclosure are presented herein for purpose of illustration and description only. It is not intended to be exhaustive or to be limited to the precise form disclosed.

Figure 1:
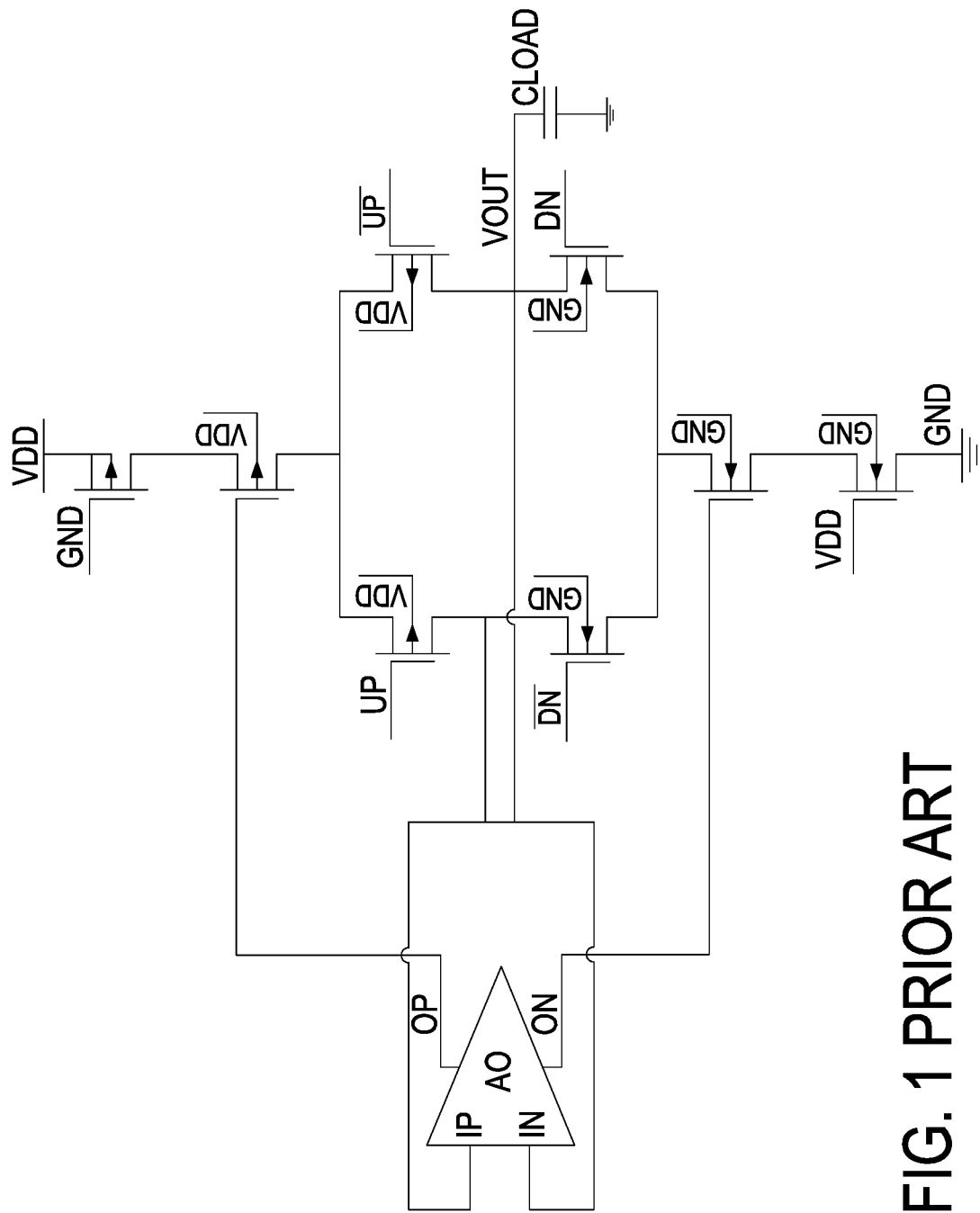
FIG. 1 is a schematic circuit diagram illustrating a modified conventional current mirror charge pump.
Figure 2:
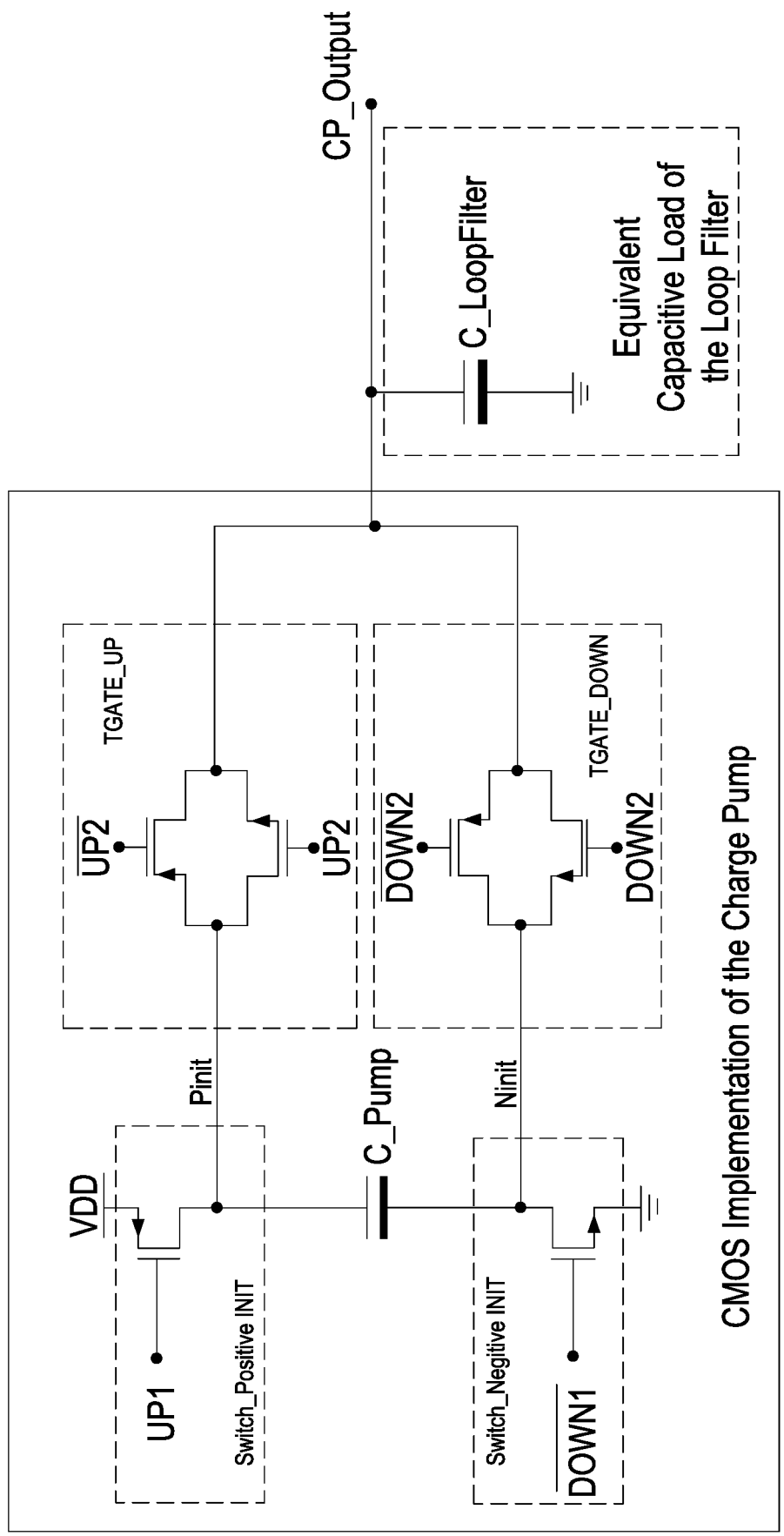
FIG. 2 is a schematic circuit diagram illustrating a conventional charge-based charge pump.
Figure 3A:
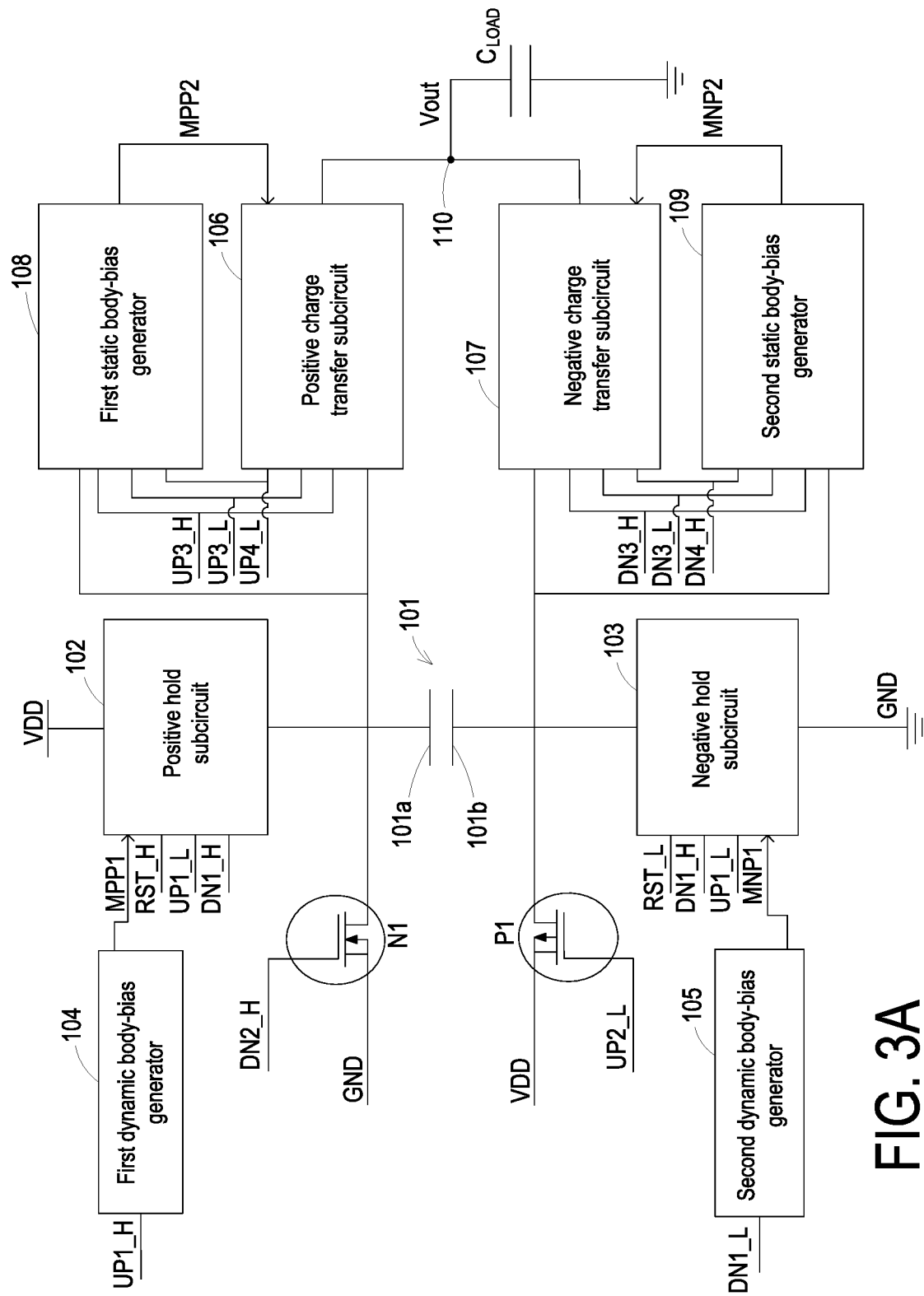
FIG. 3A and FIG. 3B are schematic diagrams illustrating a charge-based charge pump according to an embodiment of the present disclosure.
Figure 3B:
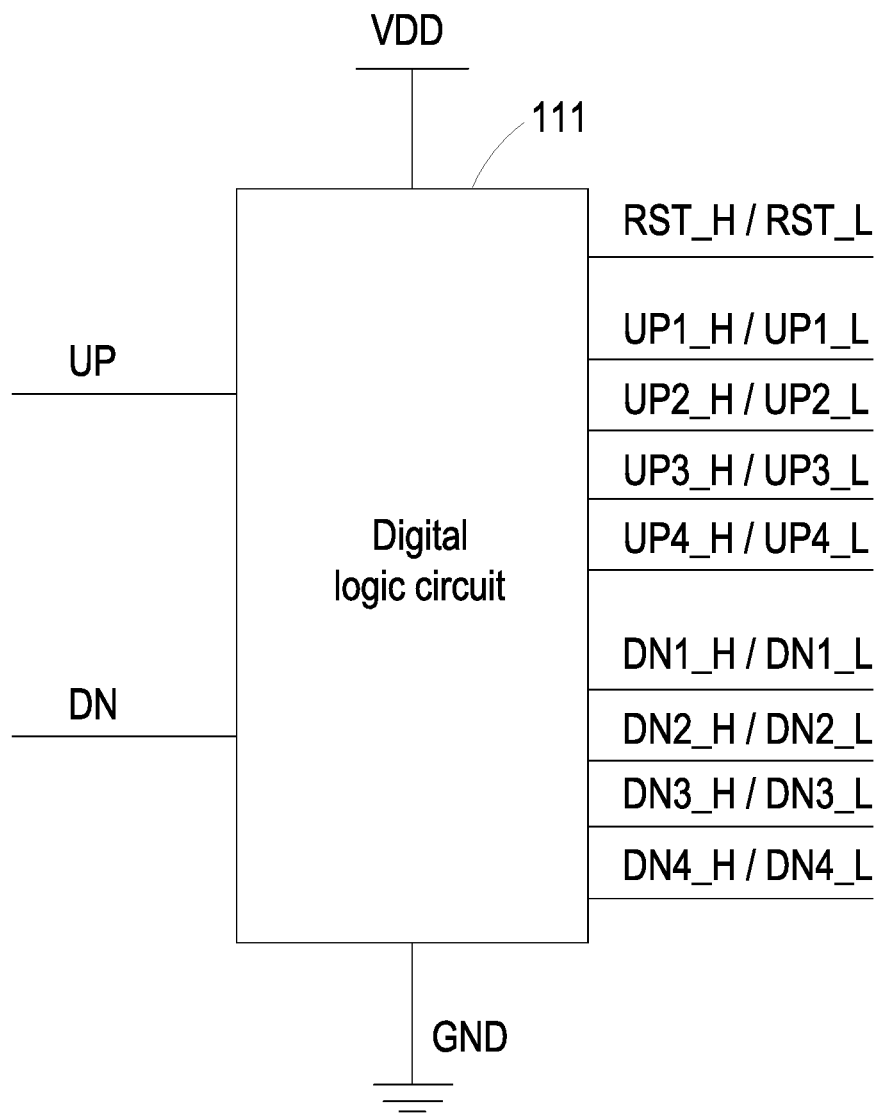

FIG. 3A and FIG. 3B are schematic diagrams illustrating a charge-based charge pump according to an embodiment of the present disclosure. As shown in FIG. 3A and FIG. 3B, the charge-based charge pump includes an input supply node, a ground node (GND) at 0V, an output node 110, a pump capacitor 101, a first NMOS (N-type Metal-Oxide-Semiconductor) N1, a first PMOS (P-type Metal-Oxide-Semiconductor) P1, a positive hold subcircuit 102, a negative hold subcircuit 103, a first dynamic body-bias generator 104, a second dynamic body-bias generator 105, a positive charge transfer subcircuit 106, a negative charge transfer subcircuit 107, a first static body-bias generator 108, a second static body-bias generator 109 and a digital logic circuit 111. The input supply node is configured for receiving an input supply voltage at a supply potential (VDD). The output node 110 is configured for outputting an output voltage Vout, and the output node 110 is for example but not limited to connect with an output load capacitor $C_{LOAD}$. The pump capacitor 101 includes a top plate 101a and a bottom plate 101b. The first NMOS N1 is electrically connected between the ground node and the top plate 101a. The positive hold subcircuit 102 is electrically connected between the input supply node and the top plate 101a. The first dynamic body-bias generator 104 is electrically connected with the positive hold subcircuit 102. The positive charge transfer subcircuit 106 is electrically connected between the top plate 101a and the output node 110. The first static body-bias generator 108 is electrically connected with the positive charge transfer subcircuit 106 and the top plate 101a. The first PMOS P1 is electrically connected between the input supply node and the bottom plate 101b. The negative hold subcircuit 103 is electrically connected between the ground node and the bottom plate 101b. The second dynamic body-bias generator 105 is electrically connected with the negative hold subcircuit 103. The negative charge transfer subcircuit 107 is electrically connected between the bottom plate 101b and the output node 110. The second static body-bias generator 109 is electrically connected with the negative charge transfer subcircuit 107 and the bottom plate 101b. The digital logic circuit 111 is electrically connected with the first NMOS N1, the positive hold subcircuit 102, the first dynamic body-bias generator 104, the positive charge transfer subcircuit 106, the first static body-bias generator 108, the first PMOS P1, the negative hold subcircuit 103, the second dynamic body-bias generator 105, the negative charge transfer subcircuit 107 and the second static body-bias generator 109. The digital logic circuit 111 receives an input pulse UP and a down pulse signal DN and outputs a plurality of switching signals for controlling the generators and subcircuits electrically connected therewith. The plurality of switching signals are utilized to turn on or off the switches within the charge-based charge pump in a specific order, so that the positive or negative potential is generated on the plates of the pump capacitor 101 and is finally transferred to the output node 110 via the positive charge transfer subcircuit 106 or the negative charge transfer subcircuit 107.

The first dynamic body-bias generator 104 dynamically generates a boosted positive potential for the PMOS devices within the positive hold subcircuit 102. The second dynamic body-bias generator 105 dynamically generates an inverted negative potential for the NMOS devices within the negative hold subcircuit 103. The first static body-bias generator 108 constantly provides the most positive potential for the PMOS devices within the positive charge transfer subcircuit 106. The second static body-bias generator 109 constantly provides the most negative potential for the NMOS devices within the negative charge transfer subcircuit 107.

The proposed charge-based charge pump (CBCP) operates in the following three modes: (1) the charge-based charge pump in default state in which no up pulse signal UP or down pulse signal DN is provided to the charge pump and the output voltage Vout remains constant; (2) the charge-based charge pump triggered by an up pulse signal UP, which results in the output voltage Vout being raised till saturating at 1.82·VDD potential; and (3) the charge-based charge pump triggered by an DN pulse signal, which results in lowering of the output voltage Vout till saturating at −0.84·VDD potential. The detailed operations of the charge-based charge pump are explained as follows.

In the default state, the positive hold subcircuit 102 connects the top plate 101a to the input supply node, and the negative hold subcircuit 103 connects the bottom plate 101b to the ground node. Accordingly, the pump capacitor 101 is charged to the supply potential VDD with its top plate 101a maintained at VDD and bottom plate 101b maintained at 0V. In addition, the top plate 101a and the bottom plate 101b are isolated from the output node by the positive charge transfer subcircuit 106 and the negative charge transfer subcircuit 107 respectively.

When the charge-based charge pump is triggered by the up pulse signal UP, the top plate 101a is isolated from the input supply node by the positive hold subcircuit 102. The bottom plate 101b is electrically connected to the input supply node via the first PMOS P1. Therefore, the potential of the top plate 101a is boosted to ~2·VDD. This is followed by enabling the positive charge transfer subcircuit 106, which connects the top plate 101a to the output node 110. As a consequence of charge transfer between the pump capacitor 101 and the load capacitor $C_{LOAD}$, the output voltage Vout is raised till it saturates at a boosted potential of 1.82·VDD.

When the charge-based charge pump is triggered by the down pulse signal DN, the bottom plate 101b is isolated from the ground node by the negative hold subcircuit 103. The top plate 101a is electrically connected to the ground node via the first NMOS N1. Therefore, the potential of the bottom plate 101b is lowered to ~−VDD. This is followed by configuring the negative charge transfer subcircuit 107 to connect the bottom plate 101b to the output node 110. The resulting charge transfer between the pump capacitor 101 and the load capacitor $C_{LOAD}$, causes the output voltage Vout to be lowered till it saturates at an inverted bottom plate potential of −0.84·VDD.

The circuit level implementation of the proposed CBCP must address several design challenges associated with its operation. Firstly, in the default state, the output voltage node must remain electrically isolated from the top and bottom plate of the pump capacitor 101 and this isolation must remain effective for the complete output voltage Vout range from −0.84·VDD to 1.82·VDD. Secondly, for the up pulse signal UP, the boosted top plate potential at ~2·VDD must remain isolated from the input supply node at VDD potential. Similarly, for the down pulse signal DN, the inverted bottom plate potential at ~−VDD must be shielded from the gnd terminal. Thirdly, it must be ensured that all the parasitic p-n junction diodes, formed within NMOS and PMOS devices in a CMOS process, must remain reverse biased (turned off) for the complete charge pump operating range. Finally, the shoot-through current should be minimized by ensuring that all the switching events are non-overlapping and the charge redistribution is executed in a predetermined sequence.

Specific circuit design techniques, as described later, are utilized to keep all the possible p-n junctions turned off for the complete range of the operation of the charge-based charge pump. The digital logic circuit 111 generates the plurality of switching signals in the required sequence and maintains a finite time difference between any two switching events, thereby preventing any loss of charge and ensuring that the charge-based charge pump continues to operate with high charge-transfer efficiency.

Figure 4:
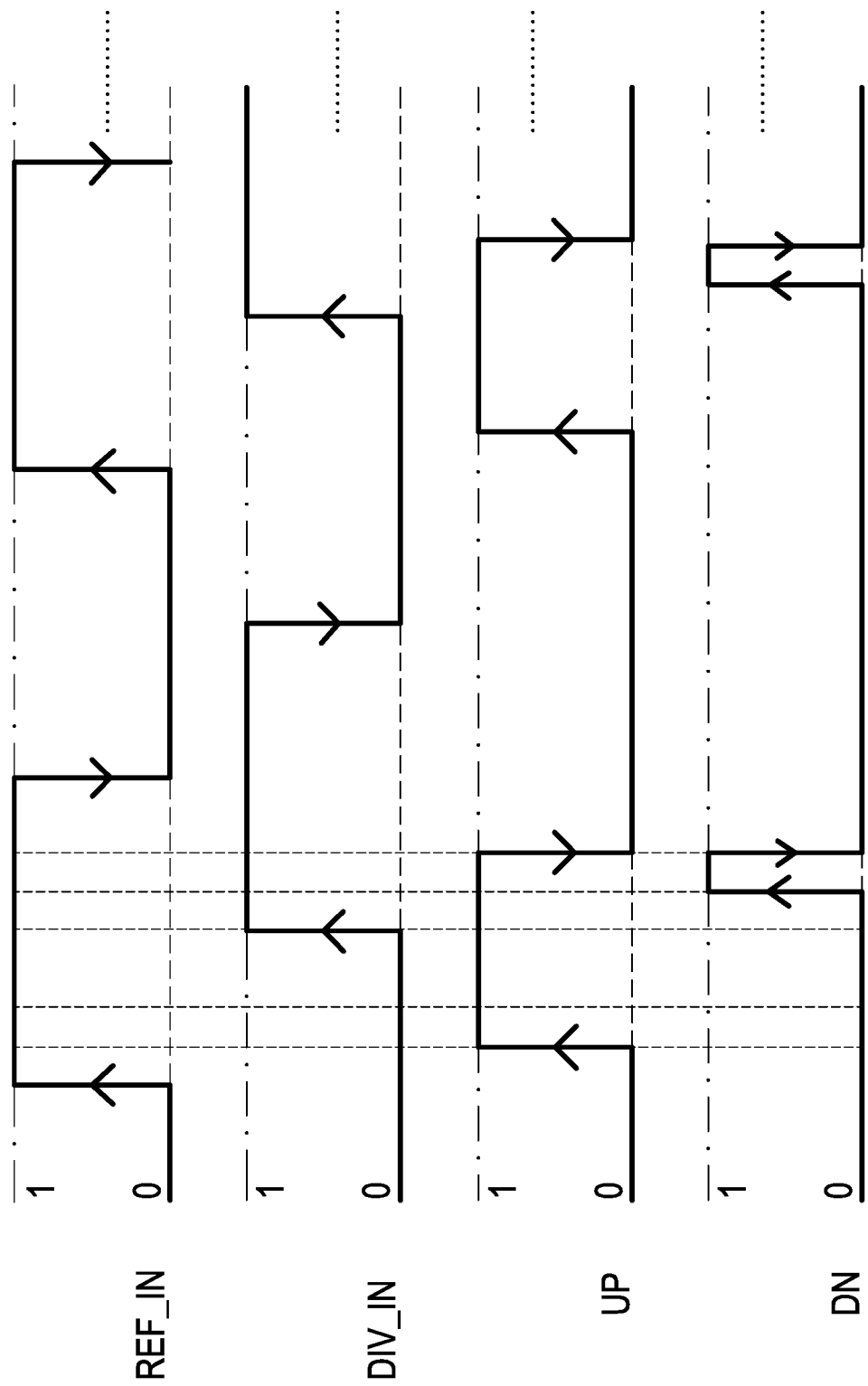
FIG. 4 is a schematic oscillogram illustrating a typical output waveform of a three-state phase-frequency detector.
Figure 5:
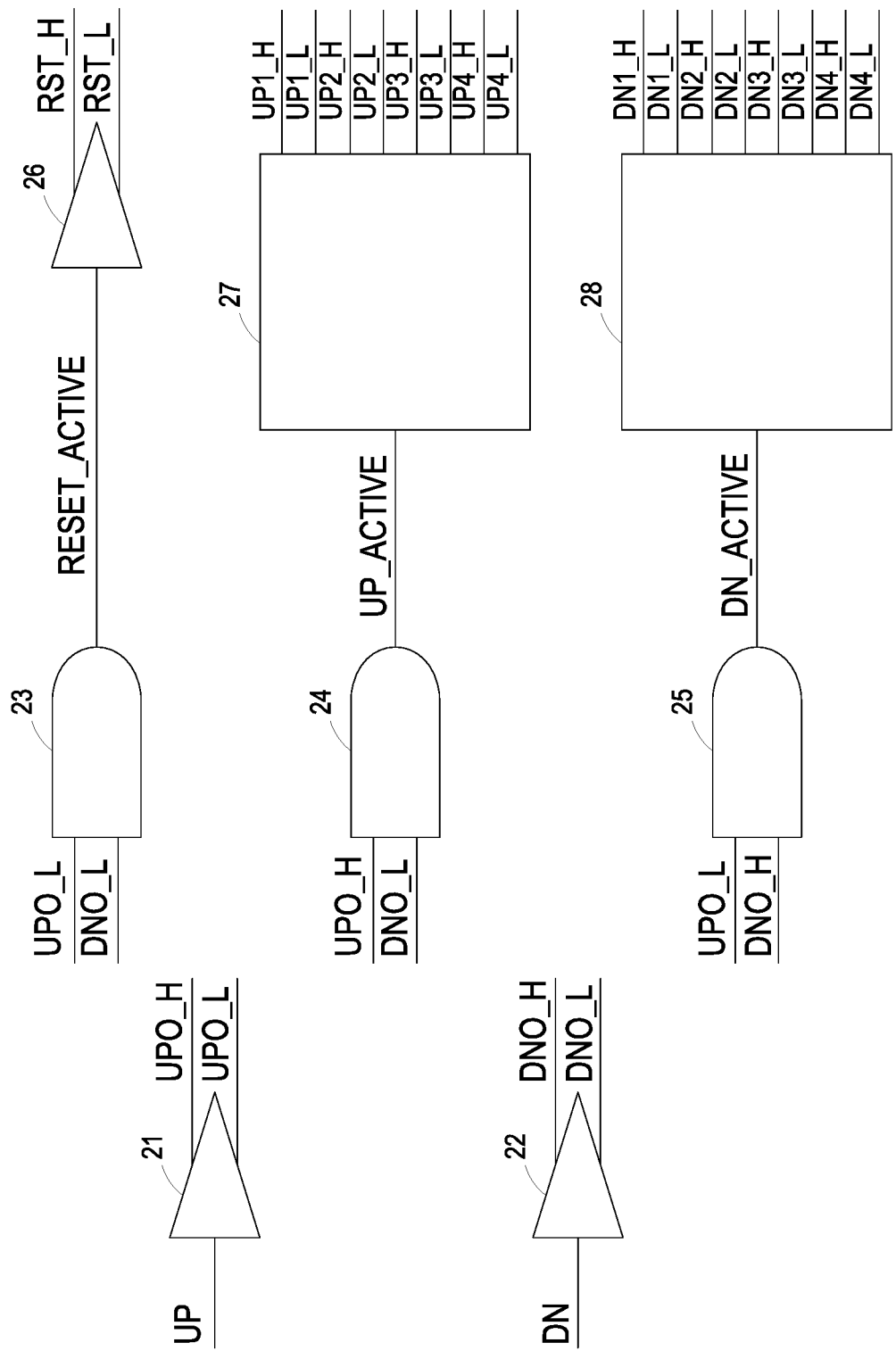
FIG. 5 is a schematic logic diagram of the digital logic circuit of FIG. 3B.
Figure 6:
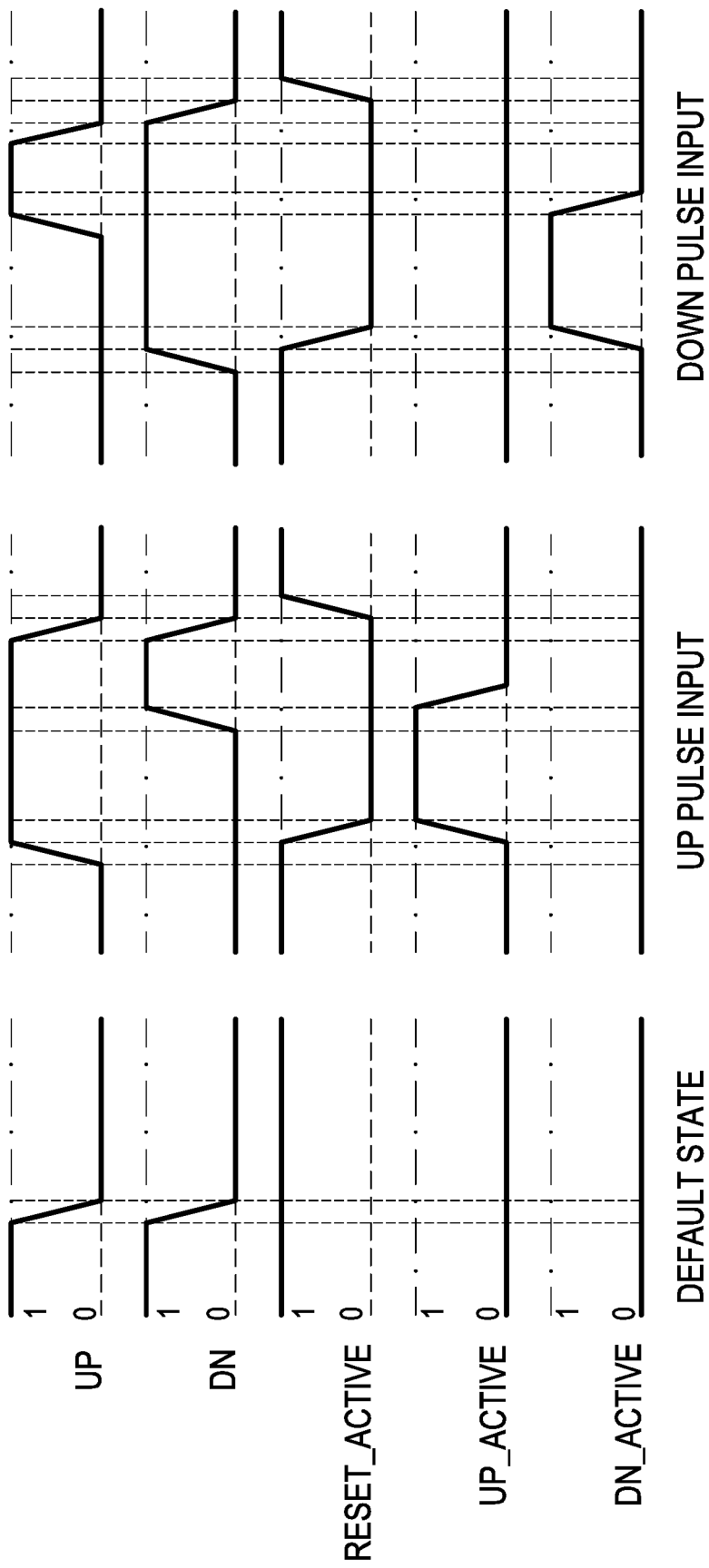
FIG. 6 schematically shows the up pulse signal, the down pulse signal and the active signals of FIG. 5 in three states of the charge-based charge pump.

FIG. 4 is a schematic oscillogram illustrating a typical output waveform of a three-state phase-frequency detector. FIG. 5 is a schematic logic diagram of the digital logic circuit of FIG. 3B. FIG. 6 schematically shows the up pulse signal, the down pulse signal and the active signals of FIG. 5 in three states of the charge-based charge pump. Preferably, but not exclusively, the digital logic circuit 111 of the charge-based charge pump receives the up pulse signal UP and the down pulse signal DN from a three-state phase-frequency detector. As shown in FIG. 4 and highlighted FIG. 6, there exists a finite duration when both the up pulse signal UP and the down pulse signal DN are active. Therefore, the up pulse signal UP and the down pulse signal DN cannot be directly buffered to generate the required switching signals. As shown FIG. 5, the digital logic circuit 111 includes three differential buffers (21, 22, 26), three AND gates (23, 24, 25) and two switched buffers (27, 28). The differential buffer (21, 22, 26) produces two out-of-phase differential signals incurring the same total delay with respect to their respective input signal. In order to remove the overlap between the up pulse signal UP and the down pulse signal DN, the up pulse signal UP and the down pulse signal DN are firstly split into four differential signals UPO_H, UPO_L, DNO_H and DNO_L by two differential buffers 21 and 22. Then, three AND gates 23, 24 and 25 are employed to extract three active signals RESET_ACTIVE, UP_ACTIVE and DN_ACTIVE according to the four differential signals UPO_H, UPO_L, DNO_H and DNO_L. The differential buffer 26 is electrically connected with the AND gate 23 for receiving the active signal RESET_ACTIVE, and the differential buffer 26 outputs two switching signals RST_H and RST_L. The switched buffer 27 is electrically connected with the AND gate 24 for receiving the active signal UP_ACTIVE, and the switched buffer 27 outputs four pairs of differential signals: UP1_H/UP1_L, UP2_H/UP2_L, UP3_H/UP3_L and UP4_H/UP4_L. The switched buffer 28 is electrically connected with the AND gate 25 for receiving the active signal DN_ACTIVE, and the switched buffer 28 outputs four pairs of differential signals: DN1_H/DN1_L, DN2_H/DN2_L, DN3_H/DN3_L and DN4_H/DN4_L.

The active signal RESET_ACTIVE is high when both the up pulse signal UP and the down pulse signal DN are low, which represents that the charge-based charge pump is in the default state. The active signal UP_ACTIVE is high when the up pulse signal UP is high and the down pulse signal DN is low. Similarly, the active signal DN_ACTIVE is high when the up pulse signal UP is low and the down pulse signal DN is high. As an example, the waveform of the three active signals RESET_ACTIVE, UP_ACTIVE and DN_ACTIVE corresponding to the three states of the charge-based charge pump are shown in FIG. 6.

Figure 7:
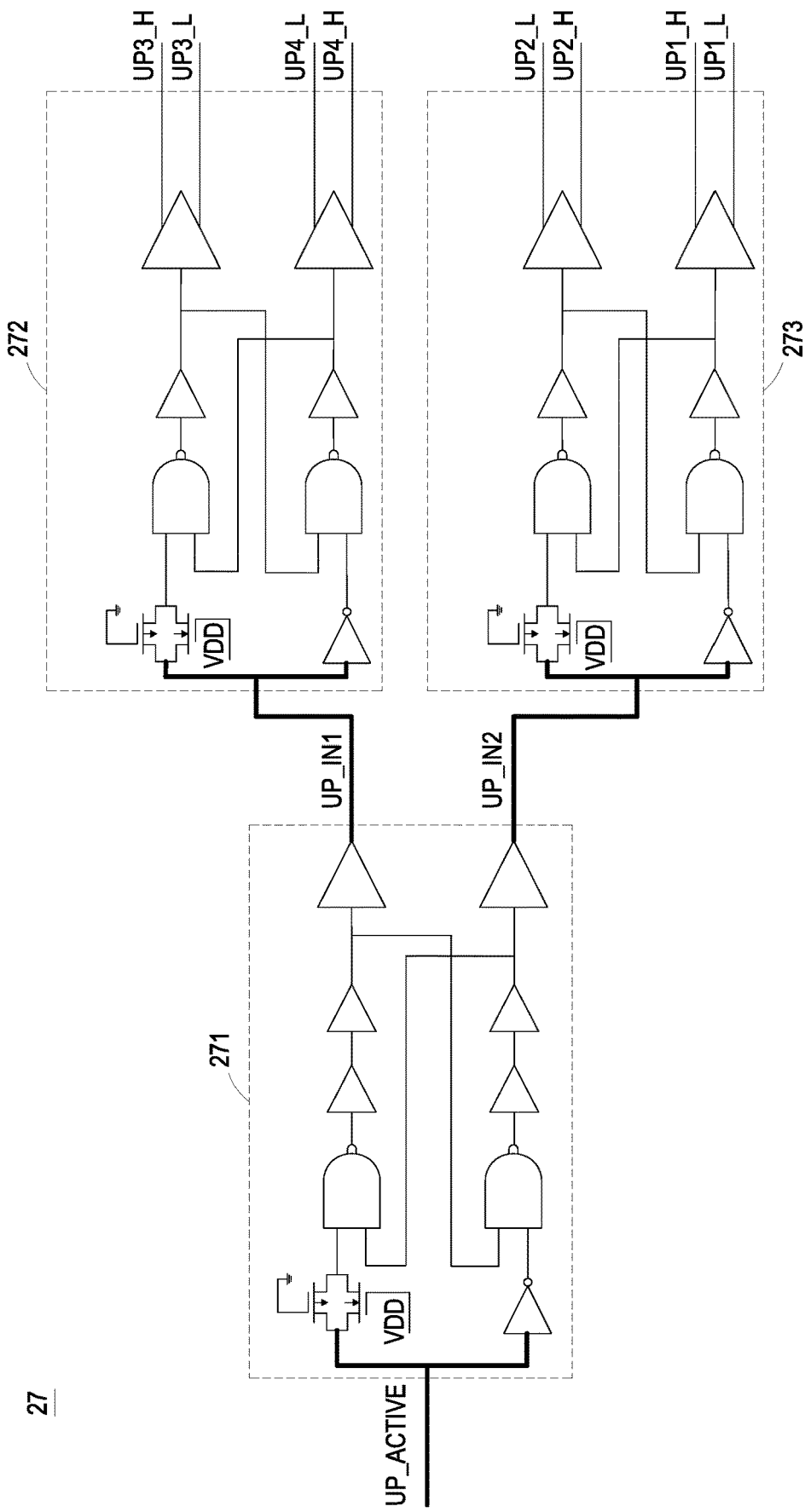
FIG. 7 is a schematic diagram illustrating the switched buffer of FIG. 5
Figure 8:
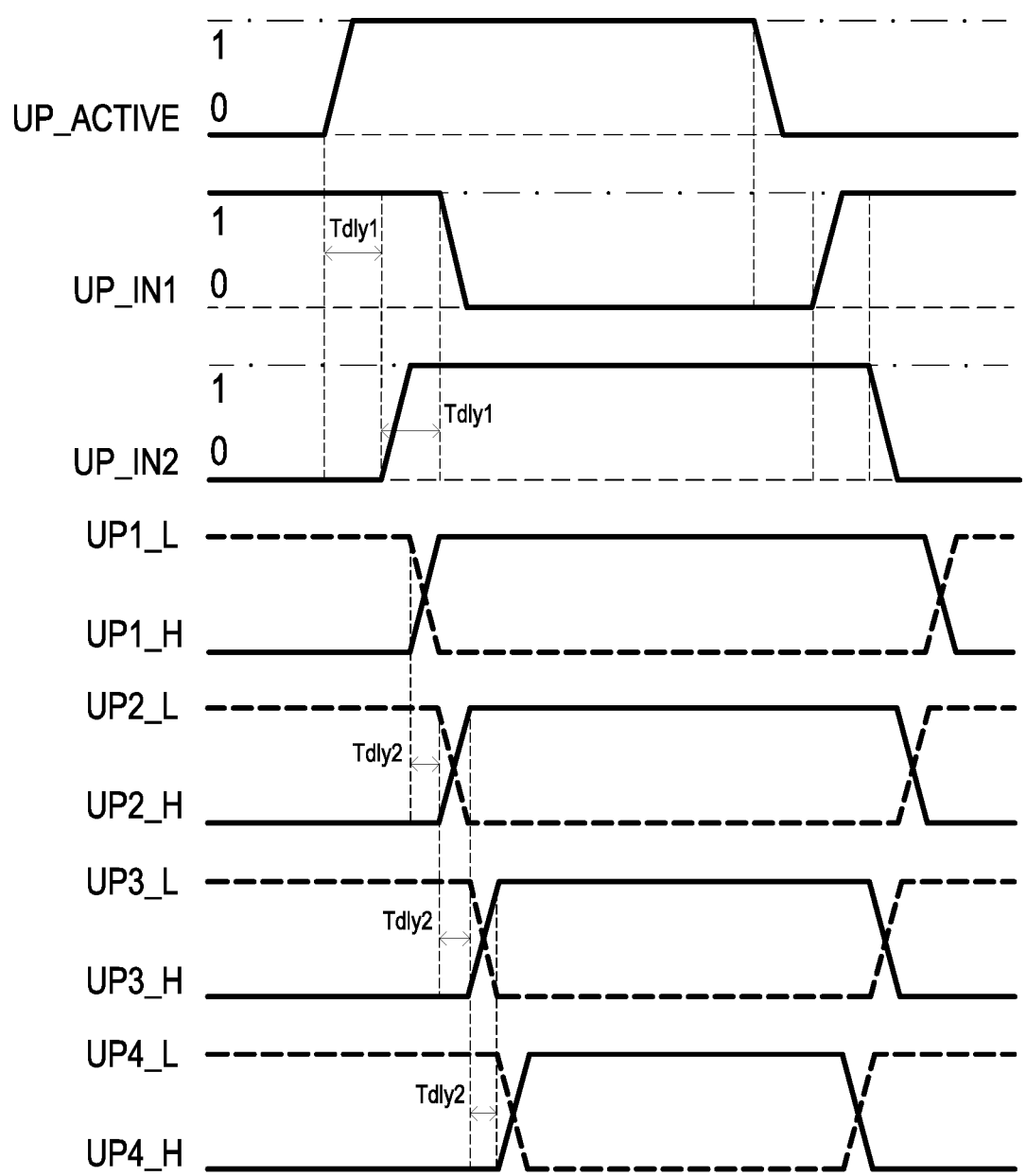
FIG. 8 is a schematic oscillogram of the signals of FIG. 7.

FIG. 7 is a schematic diagram illustrating the switched buffer of FIG. 5. FIG. 8 is a schematic oscillogram of the signals of FIG. 7. Taking the switched buffer 27 as an example, as shown in FIG. 7, the switched buffer 27 includes a primary clock splitter 271, a first secondary clock splitter 272 and a second secondary clock splitter 273. The primary clock splitter 271 is electrically connected with the AND gate 24 for receiving the active signal UP_ACTIVE, as shown in FIG. 5. The primary clock splitter 271 outputs a first internal signal UP_IN1 and a second internal signal UP_IN2 according to the active signal UP_ACTIVE. The first secondary clock splitter 272 is electrically connected with the primary clock splitter 271 for receiving the first internal signal UP_IN1. The first secondary clock splitter 272 outputs four switching signals UP3_H, UP3_L, UP4_H and UP4_L according to the first internal signal UP_IN1. The second secondary clock splitter 273 is electrically connected with the primary clock splitter 271 for receiving the second internal signal UP_IN2. The second secondary clock splitter 273 outputs four switching UP2_L, UP2_H, UP1_H and UP1_L according to the second internal signal UP_IN2.

As it is well known to those skilled in the art, the clock splitter structure generates varying path-delay for the in-phase and out-of-phase output in the transmission of logic 0 and logic 1. Thus, the clock splitter (271, 272, 273) produces two out-of-phase outputs with non-overlapping edges, where the relative phase difference between the edges determined by the relative delay incurred by the input signal to reach each of its two outputs. The primary clock splitter 271 doubles the number of delay cells in the two secondary clock splitters 272 and 273. As shown in FIG. 8, the delay time Tdly1 is approximately twice that of the delay time Tdly2. This ensures that the phase difference between the switching signal UP2_H/UP2_L and the switching signal UP3_H/UP3_L is the same as that between the switching signal UP1_H/UP1_L and the switching signal UP2_H/UP2_L or between the switching signal UP3_L/UP3_H and the switching signal UP4_H/UP4_L. Consequently, the switched buffer 27 generates the required sequence of the four pairs of switching signals with non-overlapping edges. The components of the switched buffer 28 are similar to that of the switched buffer 27, and thus the detailed description thereof is omitted.

Figure 9:
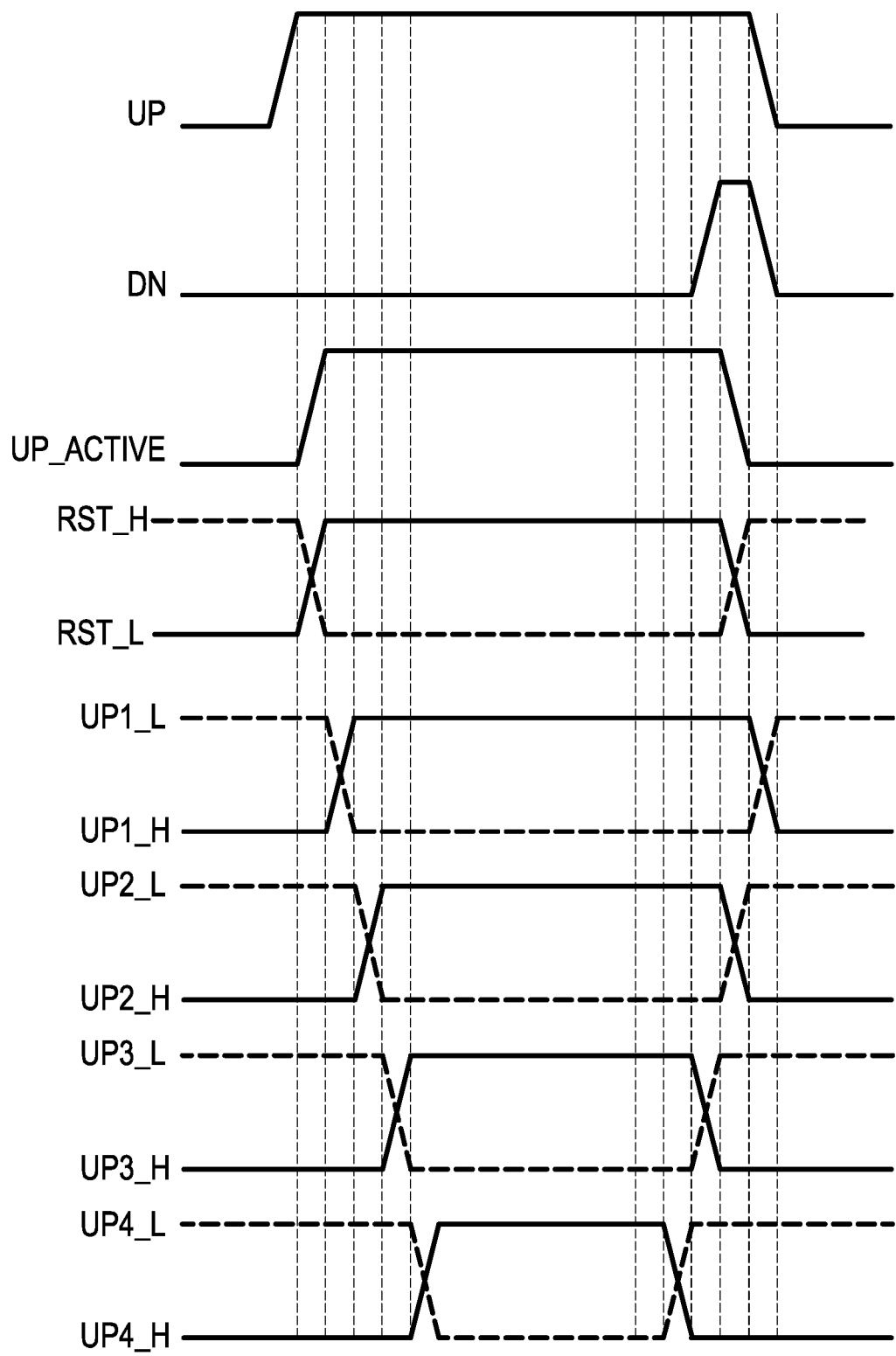
FIG. 9 and FIG. 10 schematically show the up pulse signal, the down pulse signal and the corresponding active signal and switching signals when the charge-based charge pump is triggered by the up pulse signal or the down pulse signal.
Figure 10:
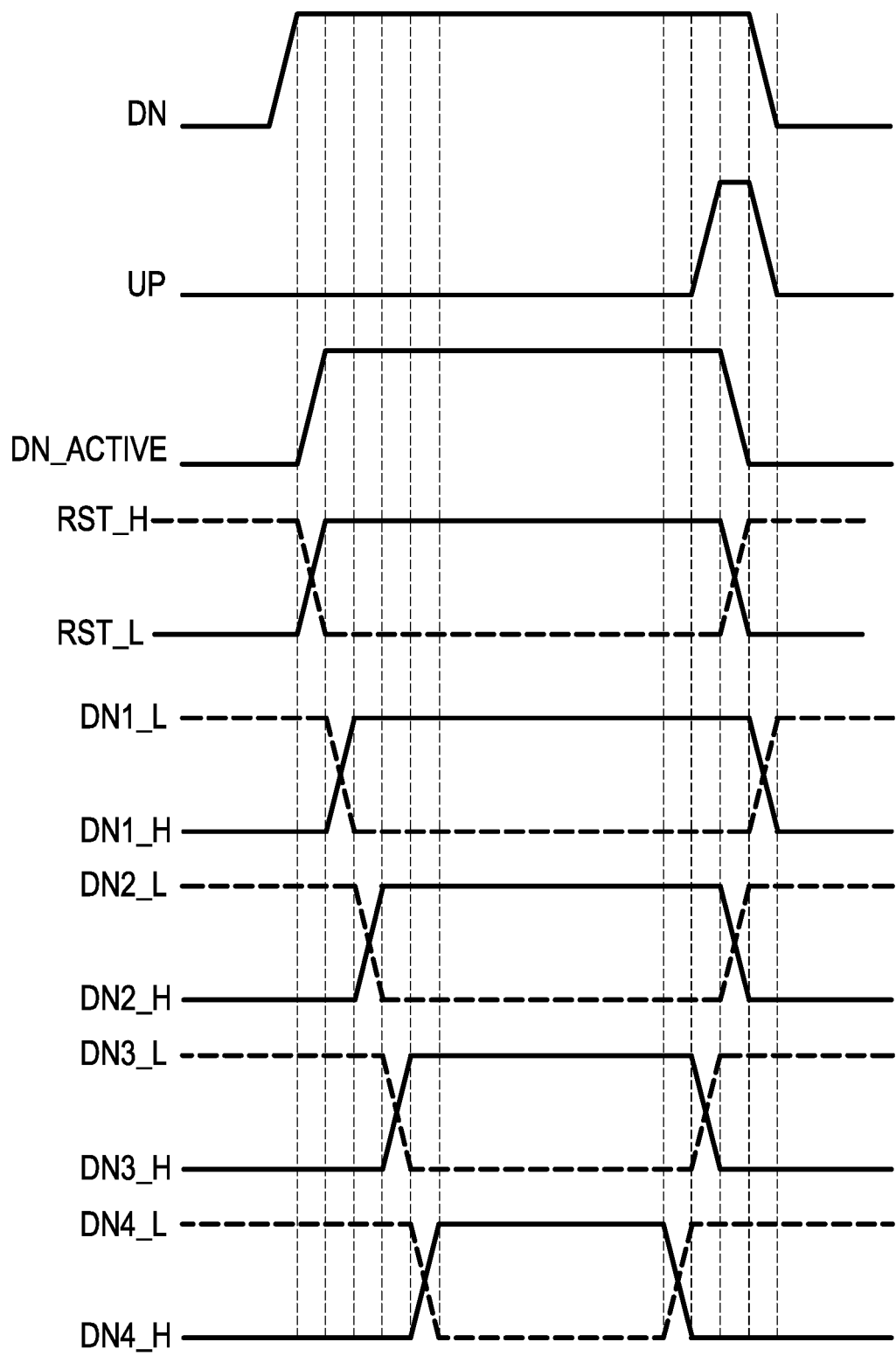

When the charge-based charge pump is triggered by the up pulse signal UP, the oscillogram of the up pulse signal UP, the active signal UP_ACTIVE and the corresponding switching signals is shown in FIG. 9. Alternatively, when the charge-based charge pump is triggered by the down pulse signal DN, the oscillogram of the down pulse signal DN, the active signal DN_ACTIVE and the corresponding switching signals is shown in FIG. 10.

Figure 11:
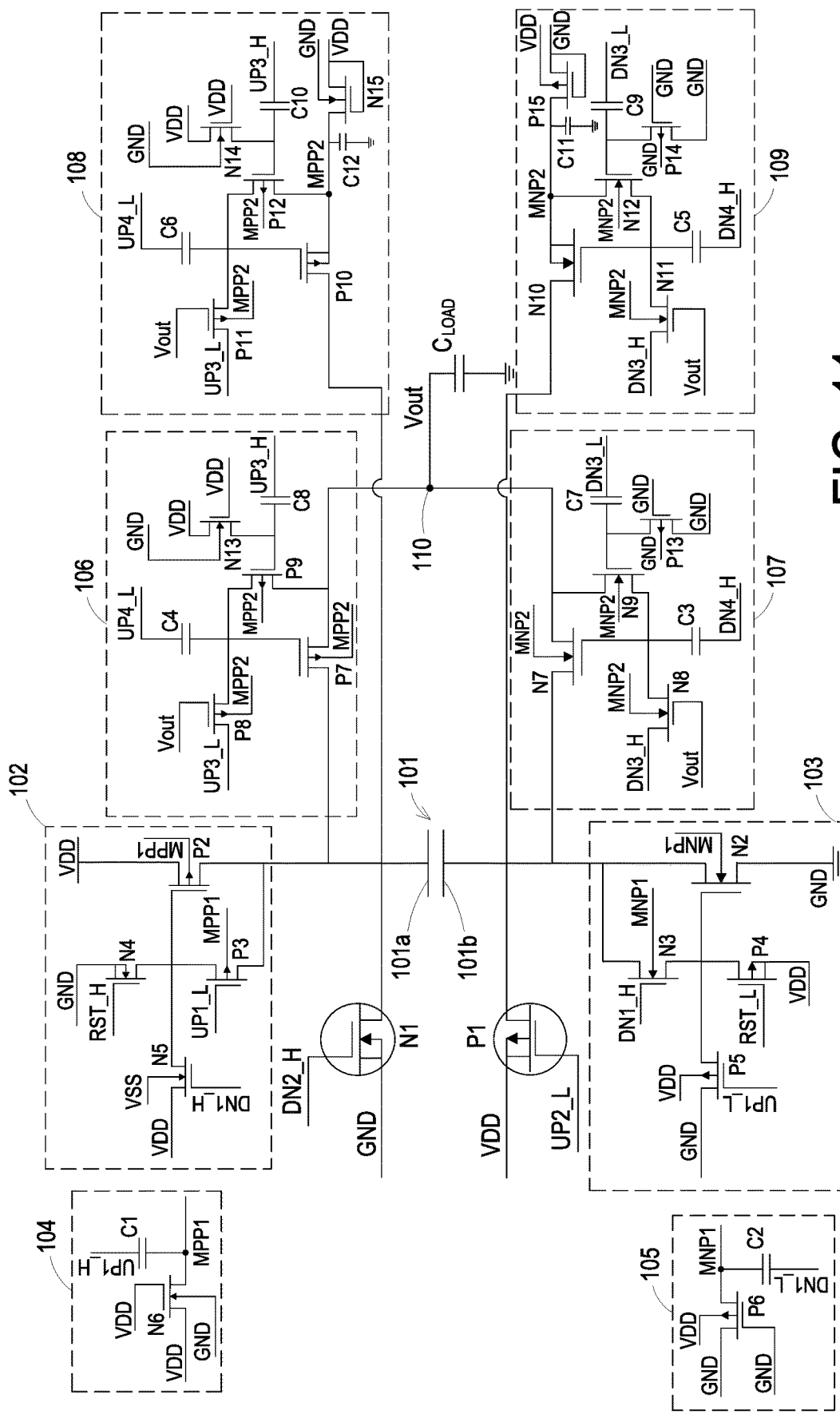
FIG. 11 is a schematic circuit diagram showing the detailed components of the charge-based charge pump of the present disclosure.

FIG. 11 is a schematic circuit diagram showing the detailed components of the charge-based charge pump of the present disclosure. The positive hold subcircuit 102 includes a second PMOS P2, a third PMOS P3, a fourth NMOS N4 and a fifth NMOS N5. The negative hold subcircuit 103 includes a second NMOS N2, a third NMOS N3, a fourth PMOS P4 and a fifth PMOS P5. The first dynamic body-bias generator 104 includes a sixth NMOS N6 and a first node MPP1. The second dynamic body-bias generator 105 includes a sixth PMOS P6 and a second node MNP1. The positive charge transfer subcircuit 106 includes a seventh PMOS P7, a eighth PMOS P8, a ninth PMOS P9 and a thirteenth NMOS N13. The negative charge transfer subcircuit 107 includes a seventh NMOS N7, a eighth NMOS N8, a ninth NMOS N9 and a thirteenth PMOS P13. The first static body-bias generator 108 includes a tenth PMOS P10, a eleventh PMOS P11, a twelfth PMOS P12, a fourteenth NMOS N14, a fifteenth NMOS N15 and a third node MPP2.

The second static body-bias generator 109 includes a tenth NMOS N10, a eleventh NMOS N11, a twelfth NMOS N12, a fourteenth PMOS P14, a fifteenth PMOS P15 and a fourth node MNP2.

The entire operations of the charge-based charge pump can be classified by three operating states, namely the charge-based charge pump in the default state, the charge-based charge pump triggered by the up pulse signal UP and the charge-based charge pump triggered by the down pulse signal DN.

In the default state, the fourth NMOS N4 and the fourth PMOS P4 are turned on by the switching signals RST_H and RST_L respectively. Therefore, the gate of the second PMOS P2 and the gate of the second NMOS N2 are maintained at ground (0V) and VDD respectively. As a result, the second PMOS P2 and the second NMOS N2 are turned on, and the pump capacitor 101 is charged to the supply potential VDD with its top plate 101a at VDD and its bottom plate 101b at ground (0V).

With regard to the positive charge transfer subcircuit 106, in the default state, the switching signals UP3_L and UP4_L are at logic high, and the switching signal UP3_H is at logic low. Since the thirteenth NMOS N13 is always on with its gate and source connected to VDD, gate of the ninth PMOS P9 is maintained at high potential. The positive charge transfer subcircuit 106 is configured to isolate the output node 110 from the top plate 101a of the pump capacitor 101. The operation of the positive charge transfer subcircuit 106 can be analyzed by splitting the completed output voltage range into three regions defined as follows.

(1) Vout<VDD−|$V_{TP\_P8}$|, where $V_{TP\_P8}$ is the threshold voltage of the eighth PMOS P8.

(2) VDD−|$V_{TP\_P8}$|<Vout<VDD+|$V_{TP\_P9}$|, where $V_{TP\_P9}$ is the threshold voltage of the ninth PMOS P9.

(3) Vout>VDD+|$V_{TP\_P9}$|.

For region (1), the eighth PMOS P8 is turned on, thereby connecting the gate of the seventh PMOS P7 to VDD and turning the seventh PMOS P7 off. For region (2), both the eighth PMOS P8 and the ninth PMOS P9 are turned off, and the gate of the seventh PMOS P7 is maintained at VDD, as there in no leakage of charge. For region (3), the ninth PMOS P9 is turned on, and the gate of the seventh PMOS P7 is connected to the output node 110. Consequently, in the default state, it can be safely concluded that the seventh PMOS P7 remains off for the entire range of the output voltage Vout from −0.84·VDD to 1.82·VDD.

With regard to the negative charge transfer subcircuit 107, in the default state, the switching signal DN3_L is at logic high, and the switching signals DN3_H and DN4_H is at logic low. Since the thirteenth PMOS P13 is always on, a gate of the ninth NMOS N9 is maintained at low potential. The negative charge transfer subcircuit 107 is configured to isolate the output node 110 from the bottom plate 101b of the pump capacitor 101. The operation of the negative charge transfer subcircuit 107 can be analyzed by splitting the output voltage Vout into three regions defined as follows.

(4) Vout>$V_{TN\_N8}$, where $V_{TN\_N8}$ is the threshold voltage of the eighth NMOS N8.

(5) −|$V_{TN\_N9}$|<Vout<$V_{TN\_N8}$, where $V_{TN\_N9}$ is the threshold voltage of the ninth NMOS N9.

(6) Vout<−|$V_{TN\_N9}$|.

For region (4), the eighth NMOS N8 is turned on, thereby causing the gate of the seventh NMOS N7 to be at ground and turning the seventh NMOS N7 off. For region (5), both the eighth NMOS N8 and the ninth NMOS N9 are turned off, and the gate of the seventh NMOS N7 is maintained at ground, as there in no leakage of charge. For region (6), the ninth NMOS N9 is turned on, and the gate of the seventh NMOS N7 is connected to the output node 110. Consequently, in the default state, it is safely concluded that the seventh NMOS N7 remains off for the entire range of the output voltage Vout from −0.84·VDD to 1.82·VDD.

Therefore, in the default state, both the seventh PMOS P7 and the seventh NMOS N7 are remained off for the entire range of the output voltage Vout from −0.84·VDD to 1.82·VDD. The output node is thus electrically isolated from the top plate 101a and the bottom plate 101b of the pump capacitor 101.

When the charge-based charge pump is triggered by the up pulse signal UP, firstly the switching signal RST_H goes low and the switching signal RST_L goes high for turning off the fourth PMOS P4 and the fourth NMOS N4 respectively. Following this, the switching signal UP1_L goes low, which turns on the third PMOS P3 in the positive hold subcircuit 102, and the fifth PMOS P5 in the negative hold subcircuit 103. As a result, the gate and drain of the second PMOS P2 are connected and low potential is forced at the gate of the second NMOS N2. Consequently, both the second PMOS P2 and the second NMOS N2 are turned off, thereby isolating the top plate 101a and bottom plate 101b from the input supply rails VDD and ground respectively. During the same switching transition, the default high potential set by the always on sixth NMOS N6 at the first node MPP1, is boosted by VDD magnitude as the switching signal UP1_H goes high. Then, the first PMOS P1 is turned on by the switching signal UP2_L, thereby connecting the bottom plate 101b to the input supply node and boosting the top plate 101a to ~2·VDD. Since the third PMOS P3 is already turned on, the gate of the second PMOS P2 acquires the boosted potential of the top plate 101a at ~2·VDD. As a result, the second PMOS P2 remains turned off, and the top plate 101a is kept isolated from the input supply node at VDD. Meanwhile, the boosted potential at the first node MPP1, connected to the body terminals of the second PMOS P2 and the third PMOS P3, prevents the drain-body p-n junction diode of these two PMOS devices from being forward biased while the top plate 101a potential is boosted, for the duration of up pulse input UP signal.

In the charge transfer process, the switching signal UP3_L goes low, thereby turning off the eighth PMOS P8. The switching signal UP3_H goes high, thereby boosting the default high potential at the gate of the ninth PMOS P9 by VDD magnitude and thus turns off the ninth PMOS P9. After a finite time lapse, the switching signal UP4_L goes low, causing the potential at the gate of the seventh PMOS P7 to be reduced by VDD. As a result, the seventh PMOS P7 turns on, and the positive charge is transferred across the drain of the seventh PMOS P7. While the charge-based charge pump returns to the default state, firstly, the switching signal UP4_L goes high, thereby turning off the seventh PMOS P7. Then, the switching signals UP3_H and UP3_L go low and high respectively. The required switching order, generated by the clock splitter employed in the digital logic circuit 111, as shown in FIG. 9, ensures that the seventh PMOS P7 turns on only for the period while both the eighth PMOS P8 and the ninth PMOS P9 are turned off.

The first static body-bias generator 108, is a replica of the positive charge transfer subcircuit 106, with its output terminal at the third node MPP2, connected to the body terminals of PMOSs P7, P8 and P9 in the positive charge transfer subcircuit 106. In the default state, the third node MPP2 is forced to high voltage by the fifteenth NMOS N15 with its gate and source connected to VDD. While the charged-based charge pump is triggered by the up pulse signal UP, the first static body-bias generator 108 is enabled alongside the positive charge transfer subcircuit 106, and therefore its output at the third node MPP2 is connected to the top plate 101a by turning on the PMOS P10 through the switching signal UP4_L. Consequently, the potential at the third node MPP2 is the same as that of the output voltage Vout, once the output voltage Vout crosses the default high potential set at the third node MPP2 by the always-on fifteenth NMOS N15. In this way, the potential at the third node MPP2 tracks and holds the steady-state most-positive potential of the charge-based charge pump and provides it as body biasing potential for the PMOSs P7, P8 and P9. Since there is almost no leakage from the body of the PMOSs, the positive potential built on the third node MPP2 is stored on the capacitor C12, irrespective of the output voltage Vout. Thus, it is ensured that the p-n junction diodes of the PMOSs P7, P8 and P9 remain turned off for the entire charge-pump operating range.

When the charge-based charge pump is triggered by the up pulse signal UP, the negative charge transfer subcircuit 107 remains in a state similar to the default state, and the seventh NMOS N7 is kept off to isolate the bottom plate 101b from the output node 110.

In an analogous operation executed for DN pulse input, when the charge-based charge pump is triggered by the down pulse signal DN, firstly the fourth NMOS N4 and the fourth PMOS P4 are turned off through the switching signal RST_H going low and the switching signal RST_L going high. This is followed by a rising edge of the switching signal DN1_H, which turns on the third NMOS N3 thereby connecting the gate and drain of the second NMOS N2, and concurrently turns on the fifth NMOS N5, resulting in high potential being forced at the gate of the second PMOS P2. Consequently, both the second NMOS N2 and the second PMOS P2 are turned off, and thus the top plate 101a and the bottom plate 101b of the pump capacitor 101 are isolated from the input supply rails VDD and ground respectively. At the same time, the switching signal DN1_L goes low, which pulls down the default low potential set by the always on the sixth PMOS P6 at the second node MNP1 by VDD magnitude. Then, the first NMOS N1 is turned on by the switching signal DN2_H, thereby connecting the top plate 101a to ground and pulling down the potential of the bottom plate 101b to ~−VDD. Since the third NMOS N3 is turned on, the gate of the second NMOS N2 acquires the inverted potential of the bottom plate 101b at ~−VDD. As a result, the second NMOS N2 remains turned off, and the bottom plate 101b is shielded from the ground node. Meanwhile, the lowered potential at the second node MNP1, connected to the body terminals of the second NMOS N2 and the third NMOS N3, prevents the drain-body p-n junction diodes of these NMOS devices from being forward biased, for the duration on the down pulse signal DN while the potential of the bottom plate 101b is being pulled down.

In the charge transfer process, the switching signal DN3_H goes high, thereby turning off the eighth NMOS N8. The switching signal DN3_L goes LOW, thereby pulling down the default low potential set at the gate of the ninth NMOS N9 by VDD magnitude, thus turning off the ninth NMOS N9. After a finite time lapse, the switching signal DN4_H goes high, thereby increasing the potential at the gate of the seventh NMOS N7 by VDD. As a result, the seventh NMOS N7 turns on, and the negative charge is transferred from the bottom plate 101b to the output node 110. While the charge-based charge pump returning to the default state, firstly, the switching signal DN4_H goes high, thereby turning off the seventh NMOS N7. Then, the switching signals DN3_H and DN3_L go low and high respectively. The required switching order, generated by the clock splitter employed in the digital logic circuit 111, as shown in FIG. 10, ensures that the seventh NMOS N7 turns on only for the period while both the eighth NMOS P8 and the ninth NMOS N9 are turned off.

The body bias potential for the NMOSs N7, N8 and N9 is provided by the second static body-bias generator 109, which is a replica of the negative charge transfer subcircuit 107, with its output terminal connected to the fourth node MNP2. In the default state, the fourth node MNP2 is forced to low voltage by the fifteenth PMOS P15 with its gate and source tied at ground. While the charged-based charge pump is triggered by the down pulse signal DN, the voltage at the fourth node MNP2 acquires the settled output voltage Vout once the output voltage Vout falls below the initial low voltage set at the fourth node MNP2. Therefore, the fourth node MNP2 tracks and holds the steady-state most negative potential of the circuit and protects any p-n junction diodes for the NMOSs N7, N8 and N9 from being turned on for the entire charge-pump operating range.

When the charge-based charge pump is triggered by the down pulse signal DN, the positive charge transfer subcircuit 106 remains in a state similar to the default state, and the seventh PMOS P7 is kept off to isolate the top plate 101a from the output node 110.

The charge-based charge pump employs a number of circuit design techniques, which enables the charge-based charge pump to achieve the extended output voltage Vout ranging from −0.84·VDD to 1.82·VDD.

Firstly, the NMOSs, including N6, N13, N14 and N15, are set of always-on low-threshold voltage (low $V_{TH}$) NMOS devices with their gate and source terminals tied at VDD, thus force a default high potential at their respective drain terminal. In addition, when the fifth NMOS N5, with its source terminal at VDD, is turned on through the switching signal DN1_H, it forces high potential at the gate of the second PMOS P2. As a complimentary implementation, the PMOSs, including P6, P13, P14 and P15, are set of always-on low-threshold voltage (low $V_{TH}$) PMOS devices with their gate and source terminals tied at GND, and thus force a default low potential at their respective drain terminals. In addition, when the fifth PMOS P5, with its source terminal at GND, is turned on through the switching signal UP1_L, it forces low potential at the gate of the second NMOS N2. The NMOSs remain safely off when the potential of the node connected therewith is higher than the supply positive potential, and the PMOSs remain safely off when their respective drain thereof acquires negative voltage.

Secondly, the body bias potential for the PMOSs in the positive hold subcircuit 102 is provided by the first dynamic body-bias generator 104, and the body bias potential for the NMOSs in the negative hold subcircuit 103 is provided by the second dynamic body-bias generator 105. When the charge-based charge pump is triggered by the up pulse signal UP, the default high potential set at the first node MPP1 of the first dynamic body-bias generator 104 is pulled up by VDD magnitude. The first node MPP1, connected at the body terminals of PMOSs P2 and P3, thus provides dynamically boosted body-biasing for these pmos devices, for the duration of up pulse input. Conversely, when the charge-based charge pump is triggered by the down pulse signal DN, the default low potential set at the second node MNP1 of the second dynamic body-bias generator 105 is pulled down by VDD magnitude. The second node MNP1, connected at the body terminals of NMOSs N2 and N3, thus provides dynamically lowered body-biasing for these nmos devices, for the duration of the down pulse signal.

Thirdly, the body bias potential for the PMOSs in the positive charge transfer subcircuit 106 is provided by the first static body-bias generator 108, and the body bias potential for the NMOSs in the negative charge transfer subcircuit 107 is provided by the second static body-bias generator 109. When the charge-based charge pump is triggered by the up pulse signal UP, the first static body-bias generator 108 follows the output voltage Vout once the output voltage Vout exceeds the initial high potential at the third node MPP2. Thus, the third node MPP2 provide the stead-state most positive potential for the PMOSs P7, P8 and P9, irrespective of the instantaneous output voltage Vout. When the charge-based charge pump is triggered by the down pulse signal DN, the second static body-bias generator 109 tracks and holds the output voltage Vout once the output voltage Vout falls below the initial low potential set at the fourth node MNP2. Thus, the fourth node MNP2 provide the steady-state most negative potential for the NMOSs N7, N8 and N9, irrespective of the instantaneous output voltage Vout.

Lastly, the digital logic circuit 111 prevents any possible loss of charge by implementing a specific switching sequence and avoiding overlapping among various switching events involved in the charge-transfer process. For instance, the seventh PMOS P7 and the seventh NMOS N7 are only turned on for an intermediate duration when the NMOS or PMOS devices connected to the gates thereof are turned off. Consequently, the output voltage Vout is kept isolated from the top plate 101a and the bottom plate 101b of the pump capacitor 101.

Figure 12:
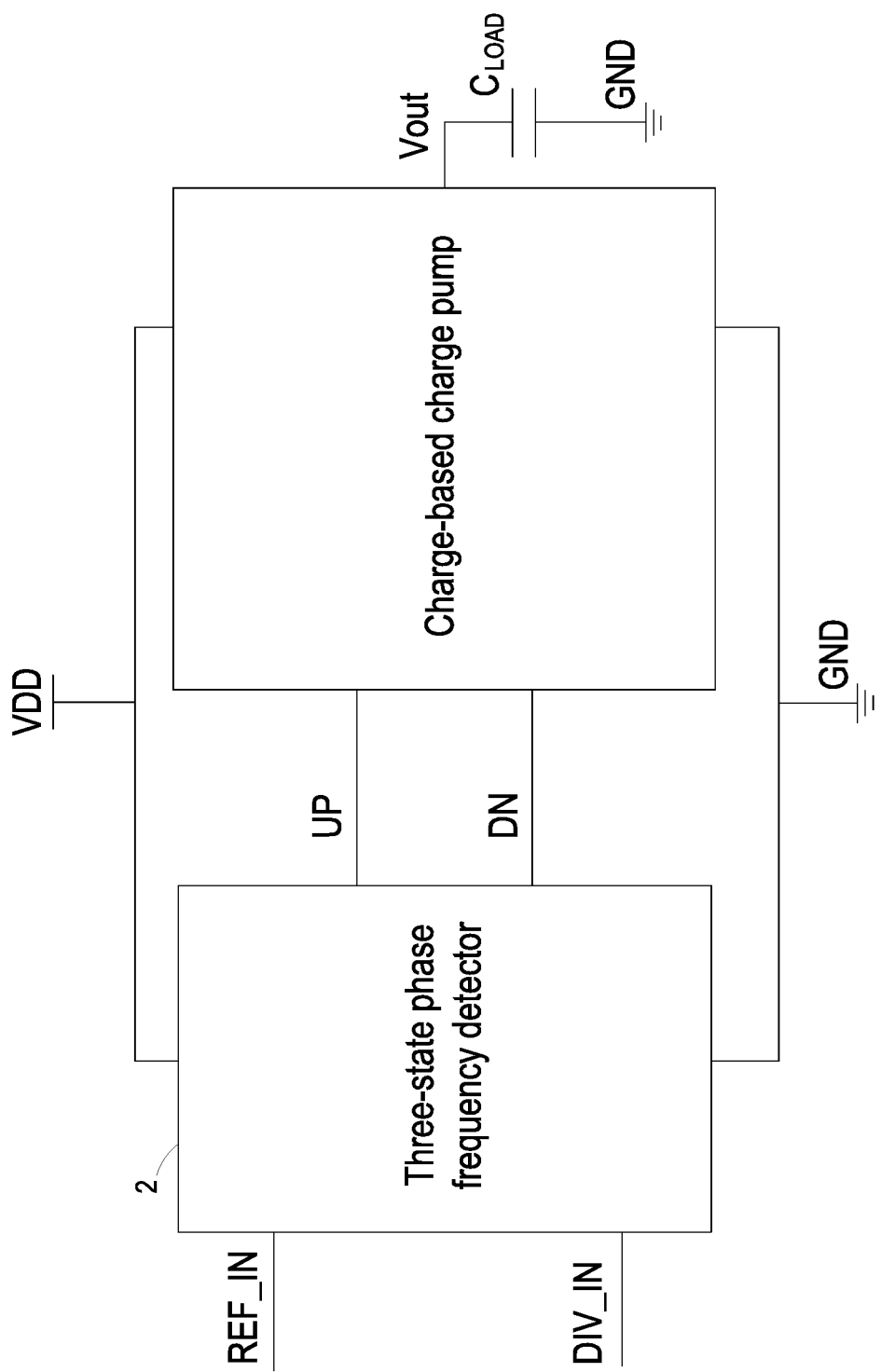
FIG. 12 is a schematic diagram illustrating a typical three-state phase frequency detector and the charge-based charge pump of the present disclosure.
Figure 13A:
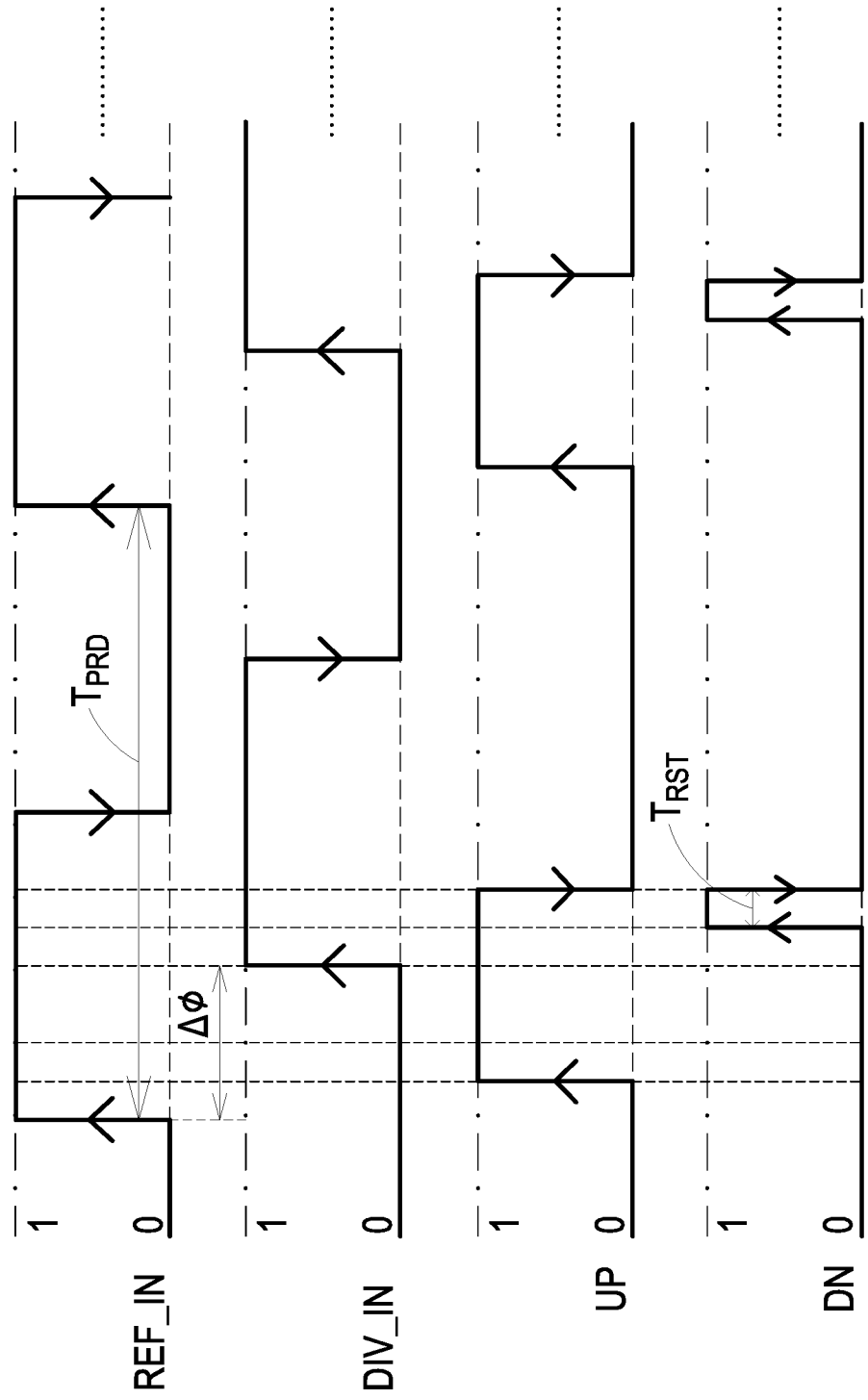
FIG. 13A and FIG. 13B schematically show the oscillogram of a reference input, a divider input, the up pulse signal and the down pulse signal of FIG. 12.
Figure 13B:
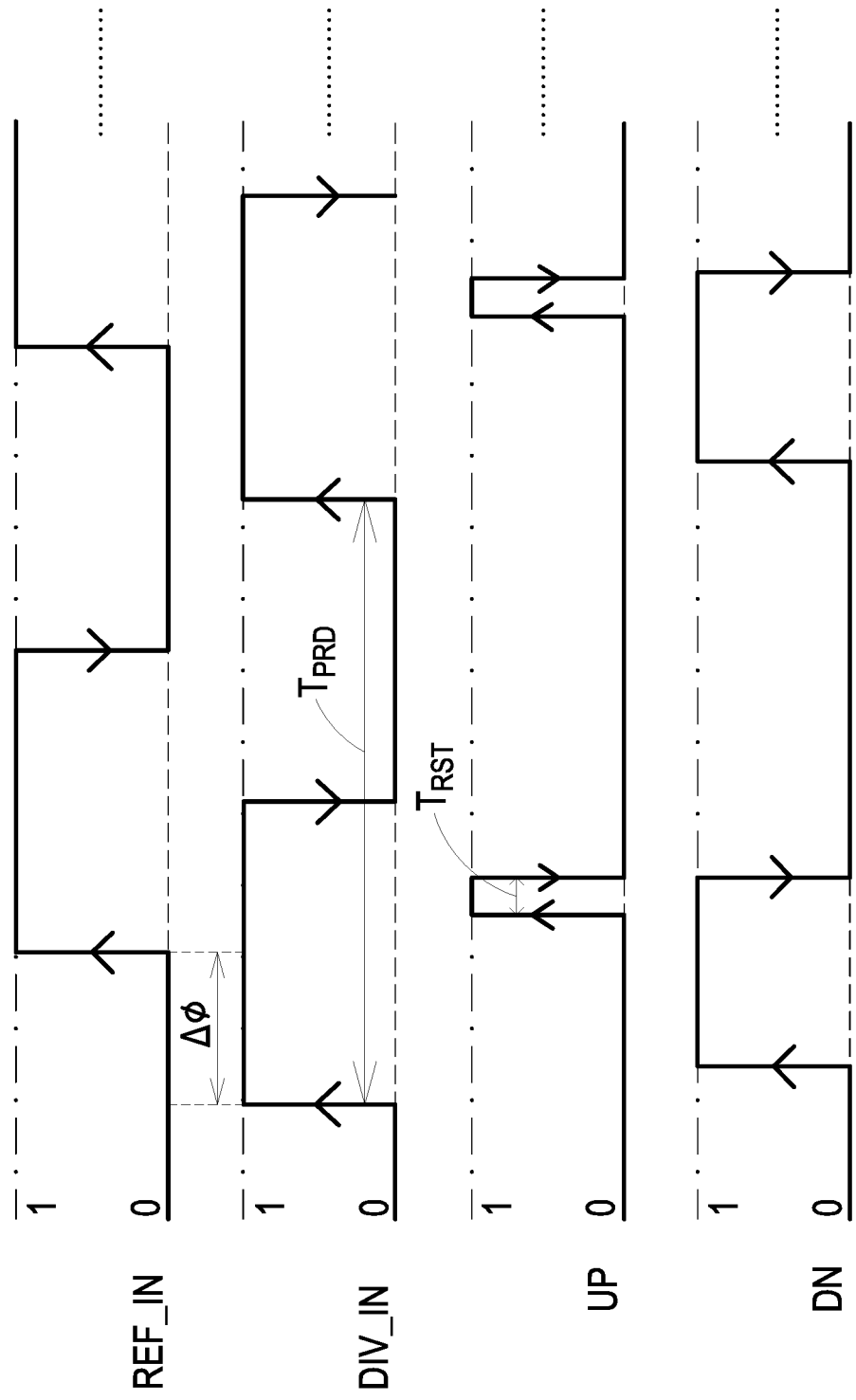
Figure 14A:
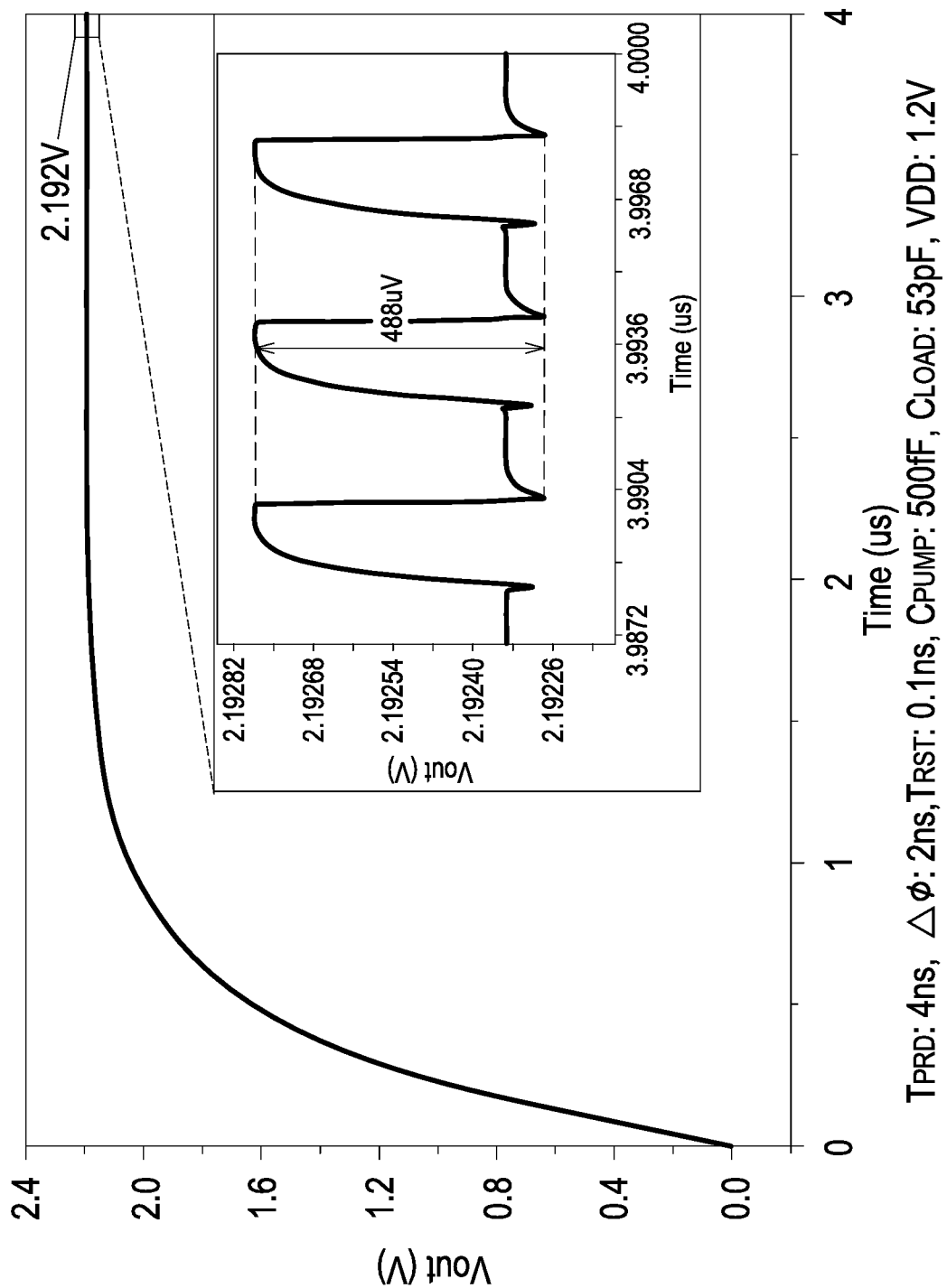
FIG. 14A is a schematic oscillogram illustrating the output voltage in response to the up pulse signal depicted in FIG. 13A and the voltage ripple of the steady output voltage.
Figure 14B:
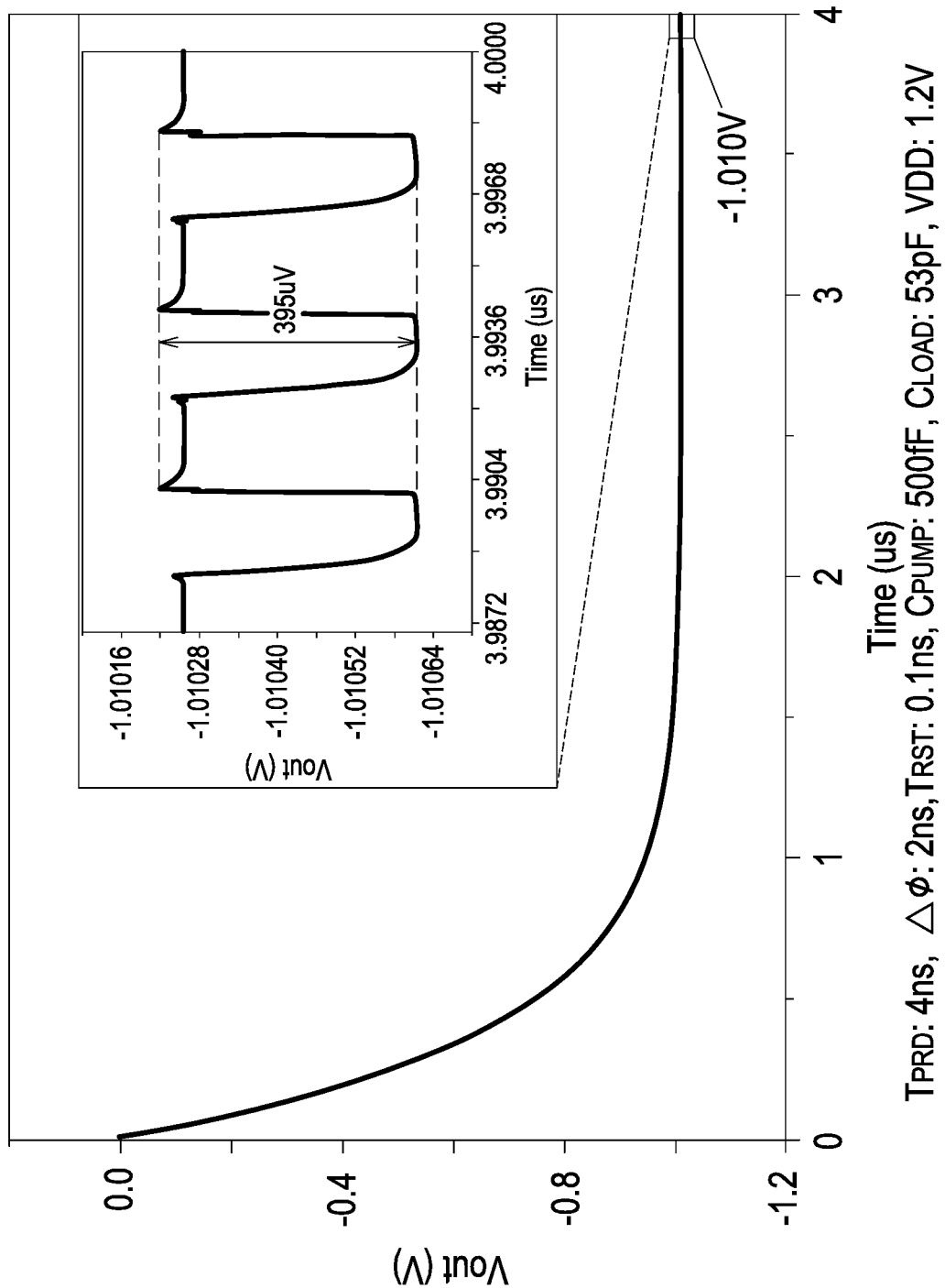
FIG. 14B is a schematic oscillogram illustrating the output voltage in response to the down pulse signal depicted in FIG. 13B and the voltage ripple of the steady output voltage.

FIG. 12 is a schematic diagram illustrating a typical three-state phase frequency detector and the charge-based charge pump of the present disclosure. FIG. 13A and FIG. 13B schematically show the oscillogram of a reference input, a divider input, the up pulse signal and the down pulse signal of FIG. 12. As shown in FIG. 12, the charge-based charge pump operation is verified with a typical three-state phase frequency detector 2 (hereinafter referred to as PFD 2). The PFD 2 receives a reference input REF_IN and a divider input DIV_IN and outputs the up pulse signal UP and the down pulse signal DN. The charge-based charge pump is electrically connected with the PFD 2 for receiving the up pulse signal UP and the down pulse signal DN. As shown in FIG. 13A, the up pulse signal UP is high when the phase of the reference input REF_IN leads the phase of the divider input DIV_IN by ΔΦ seconds. The PFD 2 returns to default state when the down pulse signal DN momentarily goes high with a reset time $T_{RST}$, whereby the reset time $T_{RST}$ is determined by the delay incurred by an internally generated reset pulse of the PFD 2. Conversely, as shown in FIG. 13B, the down pulse signal DN is high when the phase of the reference input REF_IN lags behind the phase of the divider input DIV_IN by ΔΦ seconds. The PFD 2 returns to default state when the up pulse signal UP momentarily goes high. FIG. 14A and FIG. 14B is a schematic oscillogram illustrating the charge-pump transient behavior and the steady-state output voltage ripple, in response to the up and down pulse signals depicted in FIG. 13A and FIG. 13B respectively, with a time period $T_{PRD}$ of two inputs REF_IN and DIV_IN set at 4 ns, their relative phase difference ΔΦ set at 2 ns and the width of the reset pulse $T_{RST}$ assumed to be 0.1 ns. The indicative charge-pump transfer characteristic depicted in FIG. 14A and FIG. 14B are obtained for an input supply VDD at 1.2V, 500 fF pump capacitor 101 ($C_{PUMP}$) and 53 pF load capacitor $C_{LOAD}$. It is to be noted that the value for all the aforementioned design and operating parameters is for the purposes of illustration and are in no way exclusive to the operation of the proposed charge-based charge pump. As shown in FIG. 14A, when the charge-based charge pump is triggered by the up pulse signal UP, the steady output voltage Vout reaches within 10% of 2·VDD. As shown in FIG. 14B, when the charge-based charge pump is triggered by the down pulse signal DN, the steady output voltage Vout is within 16% of −VDD. In addition, FIG. 14A and FIG. 14B also show the peak-to-peak voltage ripple at the output node when the output voltage Vout is saturated for either the up pulse signal or the down pulse signal. In either case, the steady-state ripple magnitude is under 0.5 mV and is below 0.03% of its corresponding steady-state value.

Figure 15:
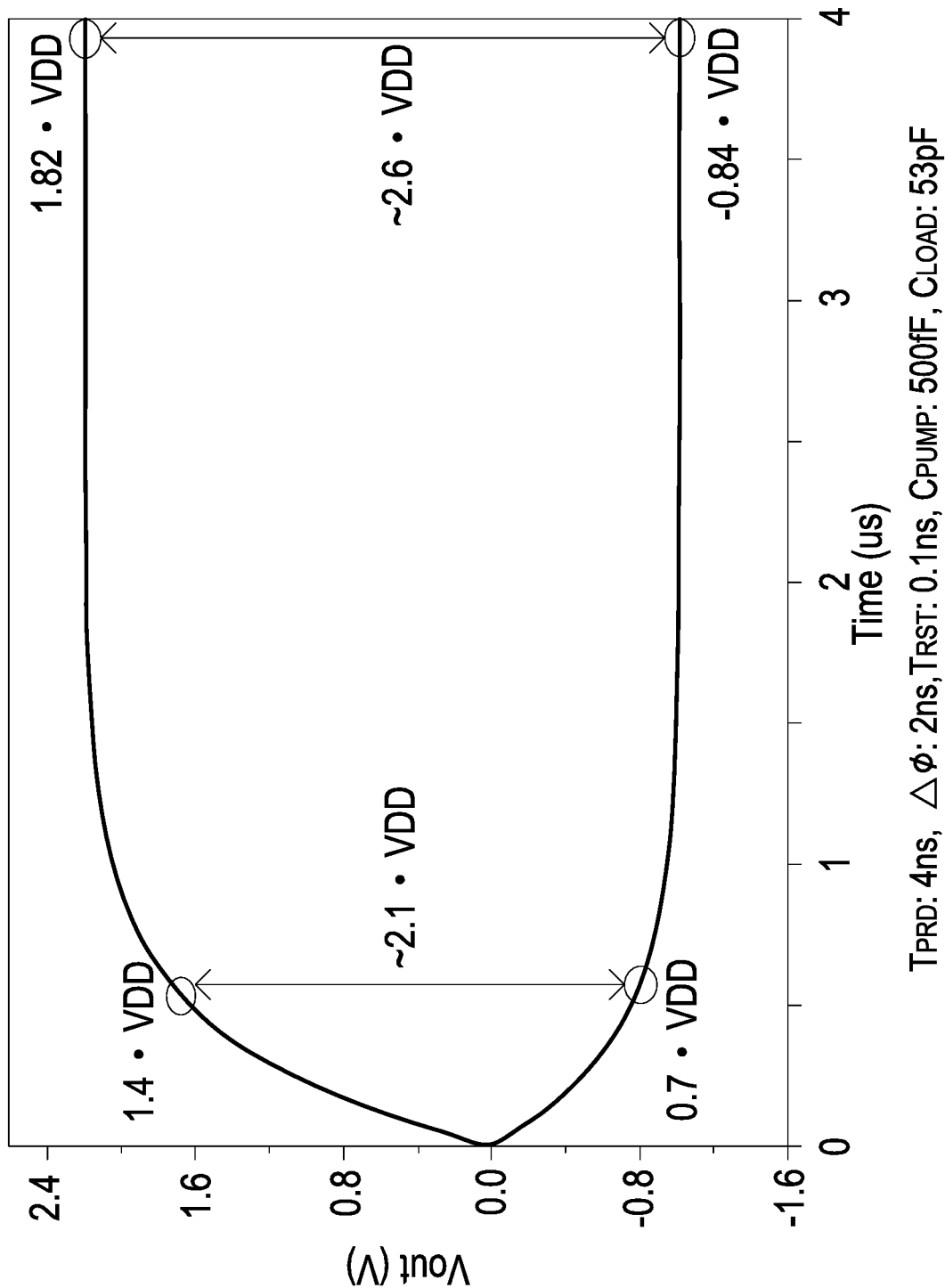
FIG. 15 is a schematic oscillogram combining the oscillogram of FIG. 14A and FIG. 14B.

FIG. 15 is a schematic oscillogram combining the oscillogram of FIG. 14A and FIG. 14B. As shown in FIG. 15, the proposed charge-based charge pump achieves a total output voltage range greater than 2.6 times the input supply potential VDD. The approximated linear range of the output voltage Vout, normalized to the supply potential VDD, can be considered to extend from ~−0.7·VDD to ~1.4·VDD. Thus, the approximated linear output range for the CP is more than 2 times the input supply potential VDD.

Figure 16A:
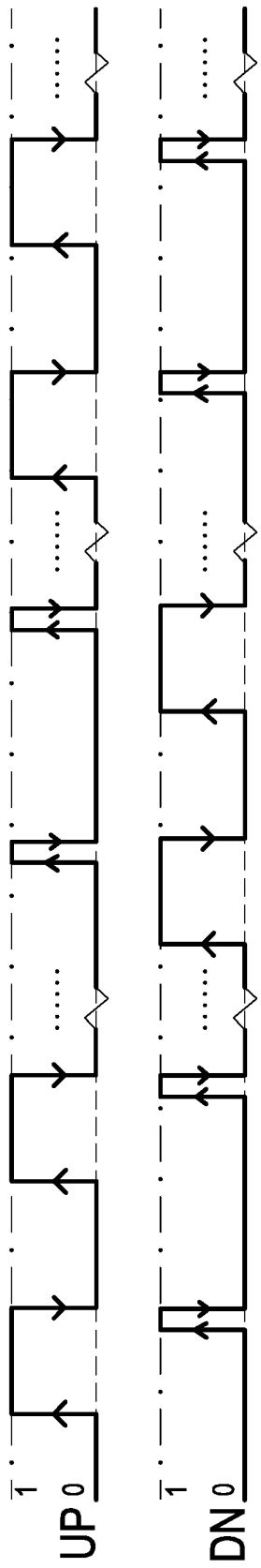
FIG. 16A and FIG. 16B are schematic oscillograms showing the test waveforms with a series of alternating up pulse signal and down pulse signal.
Figure 16B:
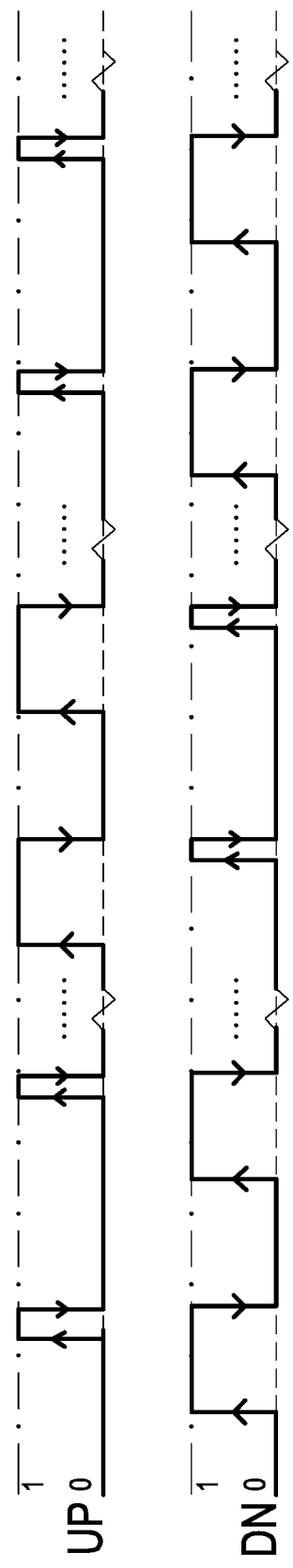
Figure 17A:
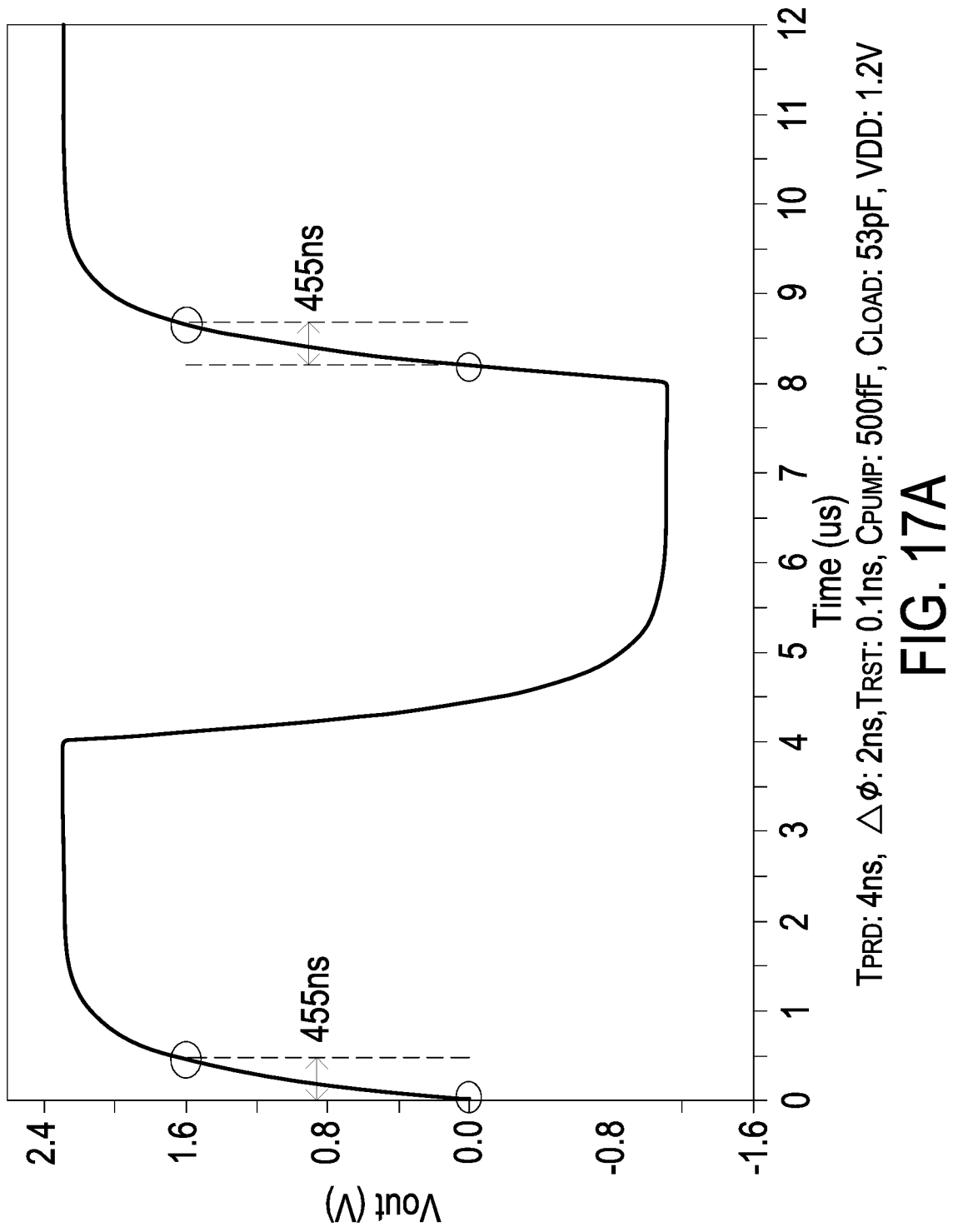
FIG. 17A and FIG. 17B are schematic oscillograms illustrating the output voltage in response to the test waveform depicted in FIG. 16A and FIG. 16B respectively.
Figure 17B:
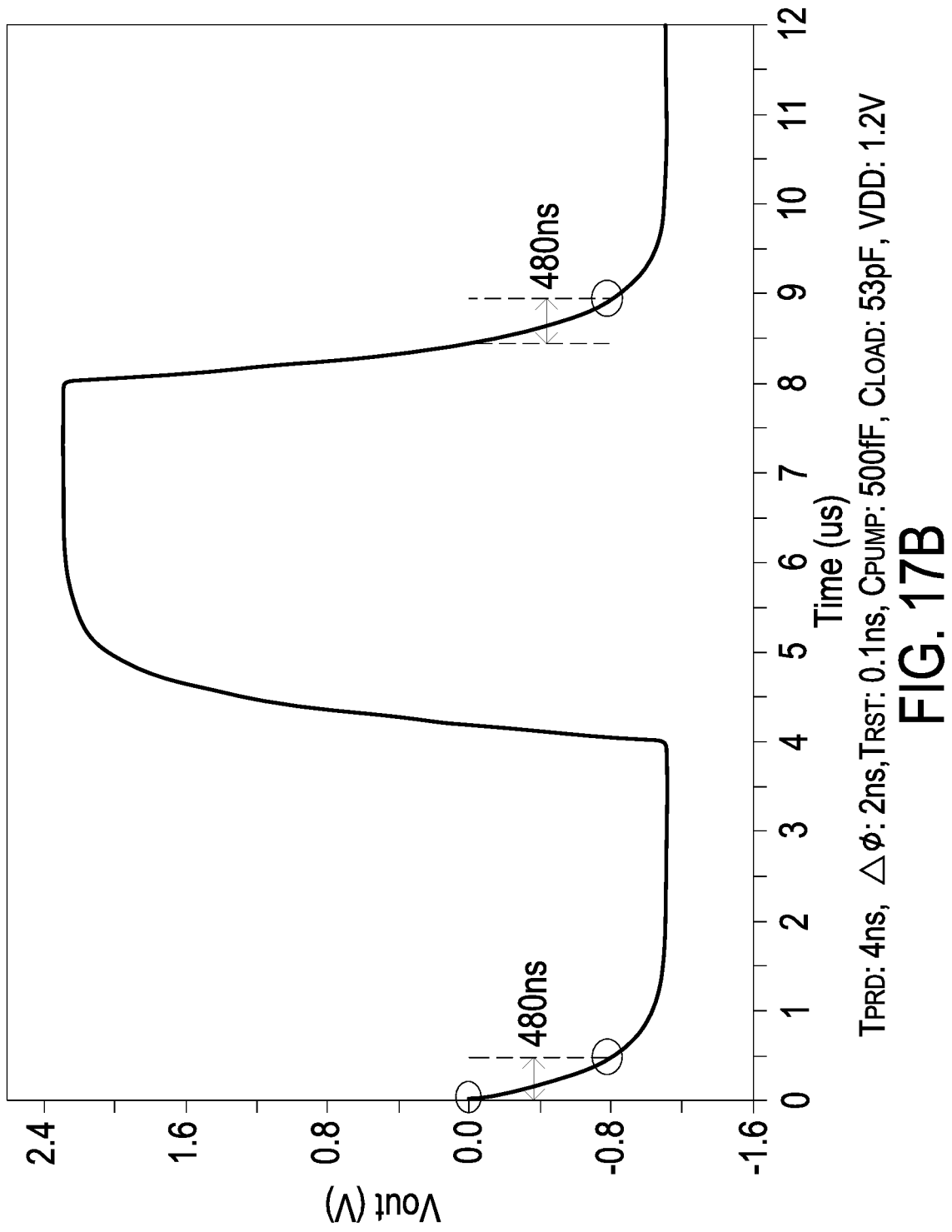

In order to be useable for any practical application, the charge-based charge pump has to maintain a transfer characteristic that is inherently free from any memory effect. This implies that for a given set of operating parameters, the time lapsed to reach from one potential to another, should remain independent of the prior state of the charge pump. This is ensured by testing the charge-based charge pump with a series of alternating up pulse signal UP and down pulse signal DN shown in FIG. 16A and FIG. 16B. FIG. 16A and FIG. 16B are schematic oscillograms showing the test waveforms with a series of alternating up pulse signal and down pulse signal. Each trigger input by the up pulse signal or the down pulse signal is continued for a duration, which is long enough as required to saturate the charge-based charge pump output, before the next set of trigger input is applied. FIG. 17A and FIG. 17B are schematic oscillograms illustrating the output voltage in response to the test waveforms depicted in FIG. 16A and FIG. 16B respectively. As an example of the illustration, which can be observed from FIG. 17A and FIG. 17B, the time taken to reach from 0V to 1.6V remains same whether the charge-based charge pump is powered up at t=0 or if it was previously saturated at −0.84·VDD. Similarly, the time lapsed for the output voltage Vout varying from 0V to −0.8V remains same whether the charge-based charge pump is powered up at t=0 or if it was previously saturated at 1.82·VDD. Thus, it is verified that no memory effect is manifested in the output response of the charge-based charge pump.

From the above descriptions, the present disclosure provides a charge-based charge pump with wide output voltage range. When the charge-based charge pump is powered by a standard supply potential (VDD), the charge-based charge pump allows the output voltage thereof to range from −0.84·VDD to 1.82·VDD. Meanwhile, the approximated linear output voltage range is also extended, and the useable linear output voltage range is wider. In addition, the digital logic circuit generates the plurality of switching signals in a required sequence and avoids overlapping among various switching events involved in the charge-transfer process, thereby preventing any loss of charge and ensuring that the charge-based charge pump continues to operate with high transfer efficiency. Moreover, the transfer characteristic of the charge-based charge pump is free from the memory effect. Further, when the output voltage is saturated at −0.84·VDD/1.82·VDD, the steady-state output voltage has a minimal ripple magnitude of under 0.03% of the corresponding steady-state output potential.

While the disclosure has been described in terms of what is presently considered to be the most practical and preferred embodiments, it is to be understood that the disclosure needs not be limited to the disclosed embodiment.

What is claimed is:

1. A charge-based charge pump, comprising:
   an input supply node configured for receiving an input supply voltage at a supply potential (VDD);
   a ground node at 0V;
   an output node configured for outputting an output voltage;
   a pump capacitor comprising a top plate and a bottom plate;
   a first NMOS electrically connected between the ground node and the top plate;
   a positive hold subcircuit electrically connected between the input supply node and the top plate of the pump capacitor;
   a first dynamic body-bias generator electrically connected with the positive hold subcircuit;
   a positive charge transfer subcircuit electrically connected between the top plate and the output node;
   a first static body-bias generator electrically connected with the positive charge transfer subcircuit and the top plate;
   a first PMOS electrically connected between the input supply node and the bottom plate;
   a negative hold subcircuit electrically connected between the ground node and the bottom plate;
   a second dynamic body-bias generator electrically connected with the negative hold subcircuit;
   a negative charge transfer subcircuit electrically connected between the bottom plate and the output node;
   a second static body-bias generator electrically connected with the negative charge transfer subcircuit and the bottom plate; and
   a digital logic circuit, wherein the digital logic circuit is configured to receive an up pulse signal and a down pulse signal and output a plurality of switching signals for controlling the first NMOS, the positive hold subcircuit, the first dynamic body-bias generator, the positive charge transfer subcircuit, the first static body-bias generator, the first PMOS, the negative hold subcircuit, the second dynamic body-bias generator, the negative charge transfer subcircuit and the second static body-bias generator electrically connected therewith, so as to allow the charge-based charge pump to achieve the output voltage ranging from −0.84·VDD to 1.82·VDD,
   wherein when the charge-based charge pump works in a default state, the top plate of the pump capacitor is electrically connected to the input supply node and is isolated from the output node, while the bottom plate of the pump capacitor is electrically connected to the ground node and is isolated from the output node,
   wherein when the charge-based charge pump is triggered by the up pulse signal, the top plate of the pump capacitor is isolated from the input supply node and is electrically connected to the output node, while the bottom plate of the pump capacitor is electrically connected to the input supply node and is isolated from the ground node and the output node,
   wherein when the charge-based charge pump is triggered by the down pulse signal, the top plate of the pump capacitor is electrically connected to the ground node and is isolated from the input supply node and the output node, while the bottom plate of the pump capacitor is isolated from the ground node and is electrically connected to the output node.

2. The charge-based charge pump according to claim 1, wherein the plurality of the switching signals are in a required sequence, and there is a finite time difference between any two switching events.

3. The charge-based charge pump according to claim 1, wherein the first dynamic body-bias generator dynamically provides a body bias potential for the PMOS devices in the positive hold subcircuit, and the second dynamic body-bias generator dynamically provides a body bias potential for the NMOS devices in the negative hold subcircuit.

4. The charge-based charge pump according to claim 1, wherein the first static body-bias generator constantly provides a body bias potential for the PMOS devices in the positive charge transfer subcircuit, and the second static body-bias generator constantly provides a body bias potential for the NMOS devices in the negative charge transfer subcircuit.

5. The charge-based charge pump according to claim 1, wherein the digital logic circuit includes three differential buffers, three AND gates and two switched buffers, two of the three differential buffers split the up pulse signal and the down pulse signal into four differential signals, the three AND gates generate three active signals according to the four differential signals, and the other differential buffer and the two switched buffer receives the three active signals and outputs the plurality of switching signals with non-overlapping edges.

6. The charge-based charge pump according to claim 1, wherein the positive charge transfer subcircuit connects the top plate to the output node when the charge-based charge pump is triggered by the up pulse signal, and the positive charge transfer subcircuit isolates the top plate from the output node when the charge-based charge pump works in the default state or when the charge-based charge pump is triggered by the down pulse signal.

7. The charge-based charge pump according to claim 1, wherein the negative charge transfer subcircuit connects the bottom plate to the output node when the charge-based charge pump is triggered by the down pulse signal, and the negative charge transfer subcircuit isolates the bottom plate from the output node when the charge-based charge pump works in the default state or when the charge-based charge pump is triggered by the up pulse signal.

8. The charge-based charge pump according to claim 1, wherein when the charge-based charge pump is triggered by the up pulse signal, the bottom plate is electrically connected to the input supply node through the first PMOS, resulting in the potential of the top plate being boosted to ~2·VDD, following which the positive charge transfer subcircuit connects the top plate to the output node resulting in the potential of the output node being raised until it saturates at 1.82·VDD.

9. The charge-based charge pump according to claim 1, wherein when the charge-based charge pump is triggered by the down pulse signal, the top plate is electrically connected to the ground node through the first NMOS, resulting in the potential of the bottom plate being pulled down to ~−VDD, following which, the negative charge transfer subcircuit connects the bottom plate to the output node resulting in the potential of the output node being lowered until it saturates at −0.84·VDD.

10. The charge-based charge pump according to claim 1, wherein the first static body-bias generator is a replica of the positive charge transfer subcircuit, and the second static body-bias generator is a replica of the negative charge transfer subcircuit.

11. The charge-based charge pump according to claim 1, wherein the output voltage of the charge-based charge pump saturates at 1.82·VDD or 90.5% of 2·VDD for the up pulse signal.

12. The charge-based charge pump according to claim 1, wherein the output voltage of the charge-based charge pump saturates at −0.84·VDD for the down pulse signal.

13. The charge-based charge pump according to claim 1, wherein the charge-based charge pump achieves a total output voltage range greater than 2.6·VDD, across its steady-state saturated output.

14. The charge-based charge pump according to claim 1, wherein the peak-to-peak ripple magnitude for the output voltage of the charge-based charge pump is under 0.03% of the corresponding steady-state output potential when the output voltage is saturated for either the up pulse signal or the down pulse signal.

15. The charge-based charge pump according to claim 1, wherein the charge pump transfer characteristic is free from memory effect, implying that the time lapsed by the charge-based charge pump to reach from one potential to another is independent of the prior state of the charge-based charge pump.

\* \* \* \* \*